(12) United States Patent
Murakami et al.

(10) Patent No.: US 8,248,348 B2
(45) Date of Patent: Aug. 21, 2012

(54) LEVEL SHIFTER CIRCUIT AND DISPLAY DEVICE PROVIDED THEREWITH

(75) Inventors: Yuhichiroh Murakami, Tenri (JP); Seijirou Gyouten, Tenri (JP); Hajime Washio, Sakurai (JP); Eiji Matsuda, Tenri (JP); Sachio Tsujino, Yao (JP); Shunsuke Hayashi, Onomichi (JP)

(73) Assignee: Sharp Kabushiki Kaisha, Osaka (JP)

( * ) Notice: Subject to any disclaimer, the term of this patent is extended or adjusted under 35 U.S.C. 154(b) by 1235 days.

(21) Appl. No.: 11/812,461

(22) Filed: Jun. 19, 2007

(65) Prior Publication Data
US 2007/0242021 A1 Oct. 18, 2007

Related U.S. Application Data

(62) Division of application No. 10/438,886, filed on May 16, 2003, now Pat. No. 7,248,243.

(30) Foreign Application Priority Data

May 17, 2002 (JP) .................................. 2002-143730
Apr. 8, 2003 (JP) .................................. 2003-104510

(51) Int. Cl.
*H03K 19/0175* (2006.01)
*H03L 5/00* (2006.01)
*G09G 5/00* (2006.01)
*G09G 3/28* (2006.01)
*G09G 3/36* (2006.01)

(52) U.S. Cl. .............. 345/98; 345/61; 345/99; 345/100; 345/204; 326/62; 327/333

(58) Field of Classification Search .................. 345/204, 345/30, 55, 61, 87, 98–100; 326/62; 327/333
See application file for complete search history.

(56) References Cited

U.S. PATENT DOCUMENTS 5,264,744 A 11/1993 Mizukami et al.
5,646,642 A * 7/1997 Maekawa et al. ............... 345/99
(Continued)

FOREIGN PATENT DOCUMENTS

JP 6-216753 8/1994
(Continued)

OTHER PUBLICATIONS

Washio et al., "Shift Register and Image Display Device", U.S. Appl. No. 09/703,918, filed Nov. 1, 2000, pp. 1-121, Figures 1-40, Corrected Filing Receipt.

(Continued)

*Primary Examiner* — Joe H Cheng
(74) *Attorney, Agent, or Firm* — Nixon & Vanderhye P.C.

(57) ABSTRACT

A level shift circuit includes first and second level shifters which respectively output first and second output signals that are produced by level shifting two kinds of input clock signals whose high level periods do not overlap. The level shift circuit also includes control transistors and control lines which, together, prevent a feedthrough current from flowing into the second level shifter when the first output signal is high level, and prevent a feedthrough current from flowing into the first level shifter when the second output signal is high level, so as to suspend the level shift operation of the first and second level shifters. With the level shift circuit, power consumption during a specific time period in a non-active period of the clock signal can be eliminated, where the specific time period of one clock signal is the active period of the other clock signal.

26 Claims, 22 Drawing Sheets

U.S. PATENT DOCUMENTS

| | | | |
|---|---|---|---|
| 5,696,722 | A | 12/1997 | Yamauchi |
| 5,748,026 | A | 5/1998 | Maekawa et al. |
| 5,841,317 | A | 11/1998 | Ohmori |
| 6,081,131 | A | 6/2000 | Ishii |
| 6,559,824 | B1 | 5/2003 | Kubota et al. |
| 6,670,944 | B1 * | 12/2003 | Ishii .............................. 345/100 |
| 6,724,361 | B1 | 4/2004 | Washio et al. |
| 6,909,417 | B2 | 6/2005 | Washio et al. |
| 6,927,753 | B2 | 8/2005 | Koyama et al. |
| 7,248,243 | B2 * | 7/2007 | Murakami et al. .............. 345/98 |
| 2002/0030528 | A1 | 3/2002 | Matsumoto et al. |
| 2003/0030616 | A1 | 2/2003 | Maeda et al. |
| 2003/0214477 | A1 | 11/2003 | Murakami et al. |
| 2004/0174334 | A1 | 9/2004 | Washio et al. |
| 2005/0243050 | A1 | 11/2005 | Koyama et al. |

FOREIGN PATENT DOCUMENTS

| | | |
|---|---|---|
| JP | 2000-035777 | 2/2000 |
| JP | 2000-163003 | 6/2000 |
| JP | 2000-174610 | 6/2000 |
| JP | 2000-305528 | 11/2000 |
| JP | 2001-159877 | 6/2001 |
| JP | 2001-307495 | 11/2001 |
| JP | 2001-318659 | 11/2001 |
| JP | 2001-326570 | 11/2001 |
| JP | 2002-207465 | 7/2002 |
| KR | 10-0400626 | 10/2003 |

OTHER PUBLICATIONS

Korean Office Action mailed Dec. 21, 2004 (w/English translation thereof).

Office Action issued for corresponding U.S. Appl. No. 10/438,886, dated Sep. 22, 2005.

Office Action issued for corresponding U.S. Appl. No. 10/438,886, dated Mar. 10, 2006.

Final Office Action issued for corresponding U.S. Appl. No. 10/438,886, dated Aug. 28, 2006.

Notice of Panel Decision issued for corresponding U.S. Appl. No. 10/438,886, dated Dec. 27, 2006.

Notice of Allowance issued for corresponding U.S. Appl. No. 10/438,886, dated Mar. 23, 2007.

* cited by examiner

ACTIVE PERIOD
DETECTING CIRCUIT

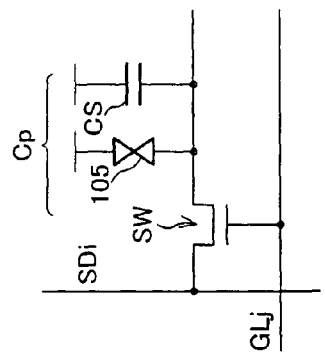
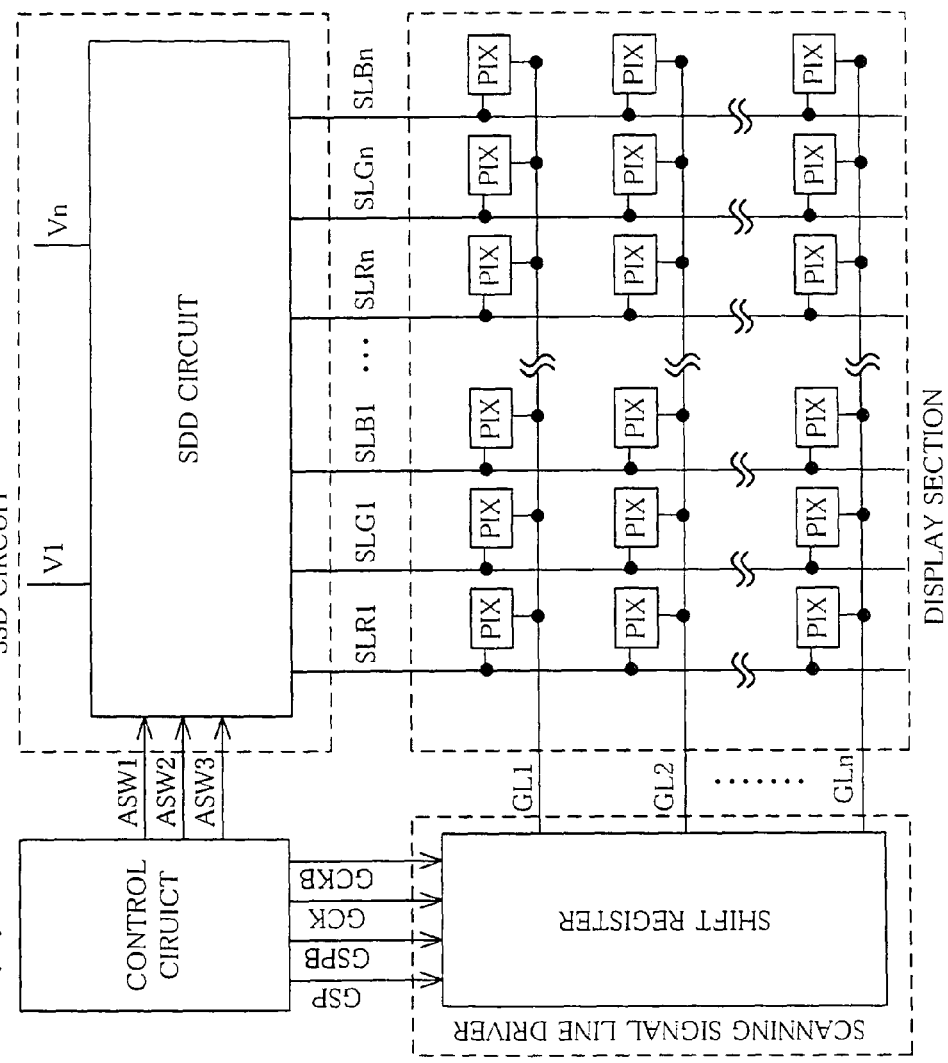
FIG. 18 (a)
FIG. 18 (b)

LEVEL SHIFTER CIRCUIT AND DISPLAY DEVICE PROVIDED THEREWITH

CROSS-REFERENCE TO RELATED APPLICATION

This application is a divisional of application Ser. No. 10/438,886, filed May 16, 2003 now U.S. Pat. No. 7,248,243, which claims the benefit under 35 U.S.C. Section 119 of Application No. 2002-143730, filed in Japan on May 17, 2002 and of Application No. 2003-104510, filed in Japan on Apr. 8, 2003.

FIELD OF THE INVENTION

The present invention relates to a level shifter circuit that is suitable for devices such as a low-voltage interface, and to a display device provided with such a level shifter circuit.

BACKGROUND OF THE INVENTION

In order to drive scanning signal lines of a liquid crystal display device in particular, some scanning signal line drivers employ clock signals which are out of phase with each other so that their high level periods and/or low level periods do not overlap.

The clock signal, when it has a lower voltage than a power voltage of the scanning line driver, needs to be raised to the level of the power voltage. For this purpose, a level shifter circuit is widely used. In this connection, there has been developed a low-temperature polysilicon driver monolithic panel, in which pixels and drivers are monolithically formed on a single glass substrate.

The transistor characteristics (threshold voltage Vth, electron mobility μ) of transistors realized by such low-temperature polysilicon, however, are lower than those of a circuit, commonly known as an IC, formed on the silicon substrate. This is particularly notable in threshold voltage Vth.

Conventionally, such transistors are used to realize a level shifter circuit in the manner described below. As one conventional example, FIG. 21 shows a circuit diagram in which two kinds of clock signals having a lower voltage than the driving voltage are raised to the level of the driving voltage, and FIG. 22 shows a timing chart of such an operation.

FIG. 22 shows two kinds of clock signals CK1 and CK2. The clock signals CK1 and CK2 each have active high level periods and non-active low level periods. Further, the clock signals CK1 and CK2 are out of phase from each other so that their high level periods do not overlap.

Vdd0 is a potential difference between a high level voltage and a low level voltage of the clock signal, wherein the high level voltage of the clock signal is lower than the driving voltage. Vdd1 is a potential difference between a high level voltage and a low level voltage of output signals OUT1, OUT2, wherein the output signals OUT1 and OUT2 are obtained by raising the voltage levels of the clock signals CK1 and CK2 to the level of the driving voltage, respectively.

FIG. 21 shows a conventional level shifter circuit. The level shifter circuit has a first level shifter LS1 which varies the level of the clock signal CK1, and a second level shifter LS2 which varies the level of the clock signal CK2. Each of the first level shifter LS1 and the second level shifter LS2 is realized by an offsetter section 51 and a level shift section 52.

Each offsetter section 51 of the first level shifter LS1 and the second level shifter LS2 shown in FIG. 21 includes a constant current source transistor P1 and an N-channel MOS transistor N1 ("transistor N1" hereinafter), wherein the former is realized by a P-channel transistor.

The source and gate of the constant current source transistor P1 are connected to a driving power supply Vdd and a power supply Vss (low level of the clock signals CK1 and CK2), respectively. The drain of the constant current source transistor P1 is connected to the drain and gate of the transistor N1 and to the gate of an N-channel MOS transistor N2 of the level shift section 52. The source of the transistor N1 is connected to the power supply Vss.

Each level shift section 52 of the first level shifter LS1 and the second level shifter LS2 shown in FIG. 21 includes a constant current source transistor P2, the N-channel MOS transistor N2 ("transistor N2" hereinafter), and inverters I1 and I2, wherein the constant current source transistor P2 is realized by a P-channel MOS transistor.

The gate of the constant current source transistor P2 is connected to the power supply Vss. The drain of the constant current source transistor P2 is connected to the drain of the transistor N2 and to the input terminal of the inverter I1. The source of the constant current source transistor P2 is connected to a driving power supply Vdd.

The clock signals CK1 and CK2, whose voltage levels are lower than a voltage (driving voltage Vdd) of the driving power supply Vdd, are respectively supplied to the first level shifter LS1 and the second level shifter LS2 via the source of the transistors N2.

The output terminal of the inverter I1 is connected to the input terminal of the inverter I2, and the inverter I2 outputs the output signal OUT1 in the first level shifter LS1 and the output signal OUT2 in the second level shifter LS2.

The level shifter circuit operates as follows. In the first level shifter LS1 and the second level shifter LS2, the offsetter section 51 applies a level shift voltage to the gate of the transistor N2, the level shift voltage being an intermediate voltage of the driving voltage Vdd and the voltage of the power supply Vss ("power voltage Vss" hereinafter). The level shift voltage will be referred to as an offset voltage. Under a steady state, the offset voltage is slightly higher than a threshold voltage Vth of the transistor N1 or the threshold voltage Vth.

In the first level shifter LS1 and the second level shifter LS2, the constant current source transistor P2 of the level shift section 52 flows a constant current ia. The constant current ia flows into the junction of the drain of the constant current source transistor P2 and the input terminal of the inverter I1, which direction of current flow is denoted as positive.

In the first level shifter LS1 and the second level shifter LS2, the transistor N2 flows a current ib into the input terminal of the clock signals CK1, CK2, whose voltage levels are lower than the driving voltage Vdd. The direction of this current flow is denoted as positive. A current that flows into the inverter I1 from the junction of the drain of the constant current source transistor P2 and the input terminal of the inverter I1 is a current ic, which direction of current flow is denoted as positive.

The offset voltage from the offsetter section 51 is applied to the gate of the transistor N2, which has essentially the same characteristics as the transistor N1. Therefore, the voltage applied to the gate of the transistor N2 is slightly higher than the threshold voltage Vth of the transistor N2 or the threshold voltage Vth. The current flow through the transistor N2 may be controlled with respect to small changes in voltage level of the clock signal CK1, CK2 supplied to the source of the transistor N2.

When the clock signal CK1, CK2 is at low voltage level, the potential difference across the gate and source of the transistor N2 is slightly greater than the threshold voltage Vth of the transistor N2 or the threshold voltage Vth, and the transistor N2 conducts. Under a conducting state of the transistor N2, the current ia flows into the terminal of the clock signal CK1, CK2 that is supplied to the source of the transistor N2 (feedthrough current).

Here, the current ic, which flows into the inverter I1 from the junction of the drain of the constant current source transistor P2 and the input terminal of the inverter I1 (positive direction), becomes a pull current that flows into the terminal of the clock signal CK1 or CK2 that is supplied to the source of the transistor N2. Thus, the current ic is negative in this case.

As a result, the stored charge at the gate of a MOS transistor in the inverter I1 is released to cause a potential drop. When the voltage decreases below the theoretical inverting voltage of the inverter I1, the inverter I1 outputs the driving voltage Vdd to the input terminal of the inverter I2. As a result, the output signal OUT1, OUT2 of the inverter I2 becomes the power voltage Vss (low level of the clock signals CK1 and CK2).

On the other hand, when the clock signal CK1, CK2 is at high voltage level, the potential difference across the gate and source of the transistor N2 becomes smaller than the threshold voltage Vth of the transistor N2. As a result, the current ib through the transistor N2 is reduced to zero, or only a small amount of current ib flows therethrough, if any.

As a result, the constant current ia through the junction of the drain of the constant current source transistor P2 and the input terminal of the inverter I1 flows into the input terminal of the inverter I1 almost completely. Thus, in this case, the current ic is positive. In response, positive charges accumulate at the gate of the MOS transistor in the inverter I1, thereby increasing the gate voltage of the MOS transistor.

When the gate voltage of the MOS transistor exceeds the theoretical inverting voltage of the inverter I1, the inverter I1 outputs the power voltage Vss to the input terminal of the inverter I2. The inverter I2, in response, outputs the driving voltage Vdd.

In this manner, the high voltage level of the clock signal CK1, CK2, which is lower than the driving voltage Vdd, is raised to the level of the driving voltage Vdd, so as to generate the output voltage OUT1, OUT2.

The clock signals with the increased voltage levels may be used to operate the shift register, for example, as disclosed in Japanese Publication for Unexamined Patent Application No. 135093/2001 (Tokukai 2001-135093), so as to drive the scanning line driver of a liquid crystal display device.

The corresponding US application (U.S. Ser. No. 09/703,918; filed on Nov. 1, 2000) of the foregoing publication is incorporated herein as a reference.

As another related art of the present invention, Japanese Publication for Unexamined Patent Application No. 298445/1996 (Tokukaihei 8-298445; published on Nov. 12, 1996) is available. (Corresponding U.S. Pat. No. 5,841,317; Date of patent Nov. 24, 1998.)

In recent years, liquid crystal display devices have been widely used as display devices of small portable terminals or portable phones. In these applications, low power consumption is strongly desired in order to satisfy the portable functionality of these devices.

However, in the shift register of the foregoing publication using the level shifter circuit as described above, the level shifters, such as the first level shifter LS1 and the second level shifter LS2, making up the level shifter circuit operate by constantly supplying current to the transistors, including the constant current source transistor P1 and the transistor N1 of the offsetter section 51, and the constant current source transistor P2 and the transistor N2 of the level shift section 52.

In this case, the plurality of level shifters consumes power even when the clock signals are not required, i.e., when the clock signals are non-active. This prevents the power consumption of the level shifter circuit from being reduced, with the result that the power consumption of the liquid crystal display device is increased. Consequently, batteries or other power sources of the small portable terminals or portable phones run out quickly, reducing the operable hours of these devices.

SUMMARY OF THE INVENTION

The present invention was made in view of the foregoing problems, and it is an object of the present invention to provide a level shifter circuit that consumes low power, and to provide a display device equipped with such a level shifter circuit.

In order to achieve the foregoing object, the present invention provides a level shifter circuit that includes a level shifter for level shifting N kinds of clock signals (N being an integer of not less than 2) which are out of phase with each other so as to have non-overlapping high level periods and/or non-overlapping low level periods, the level shifter being provided for each of the N kinds of clock signals and carrying out level shifting so that a high level of the clock signal is converted to either a high level or low level of a predetermined power voltage, and a low level of the clock signal is converted to the other level of the predetermined power voltage, the level shifter carrying out the level shifting using a predetermined voltage that is generated by flowing a predetermined constant current through a predetermined circuit of the level shifter during a non-active period of the corresponding clock signal, and the level shifter circuit further includes: active period detecting means for detecting an active period or a non-active period in the clock signal of the level shifter; and level shifting control means for suspending the level shifting during a specific time period of the non-active period as detected by the active period detecting means, by preventing the constant current from flowing into the predetermined circuit.

According to this aspect of the invention, the level shifter carries out a normal level shifting operation during the active period of the clock signal and during the non-active period of the clock signal except for the specific time period.

The level shifting is carried out with respect to each of the N kinds of clock signals which are out of phase with each other so as to have non-overlapping high level periods and/or non-overlapping low level periods, so that a high level of the clock signal is converted to either a high level or low level of a predetermined power voltage, and a low level of the clock signal is converted to the other level of the predetermined power voltage.

During the non-active period other than the specific time period, the level shifter carries out the level shifting using a predetermined voltage that is generated by flowing a predetermined constant current in a predetermined circuit.

The active period detecting means detects an active period or a non-active period in the clock signal with respect to each level shifter, and the level shifting control means operates in the manner described below in the specific time period of the non-active period as detected by the active period detecting means.

During the specific time period of the non-active period, the level shifting control means prevents the predetermined constant current from flowing into the predetermined circuit of the level shifter, so as to suspend the level shifting of the level shifter.

The non-active period does not require level shifting into a different level, and therefore by preventing the constant current from flowing into the predetermined circuit during the specific time period of the non-active period, the power dissipation, which would have been caused by the constant current, can be eliminated. As a result, the power consumption of the level shifter circuit can be reduced.

For a fuller understanding of the nature and advantages of the invention, reference should be made to the ensuing detailed description taken in conjunction with the accompanying drawings.

BRIEF DESCRIPTION OF THE DRAWINGS

FIG. 18(a) is a block diagram showing an overall structure of a display device of an Eighth Embodiment according to the present invention.

FIG. 18(b) is a block diagram showing a pixel portion of the display device.

DESCRIPTION OF THE EMBODIMENTS

First Embodiment

Figure 1:
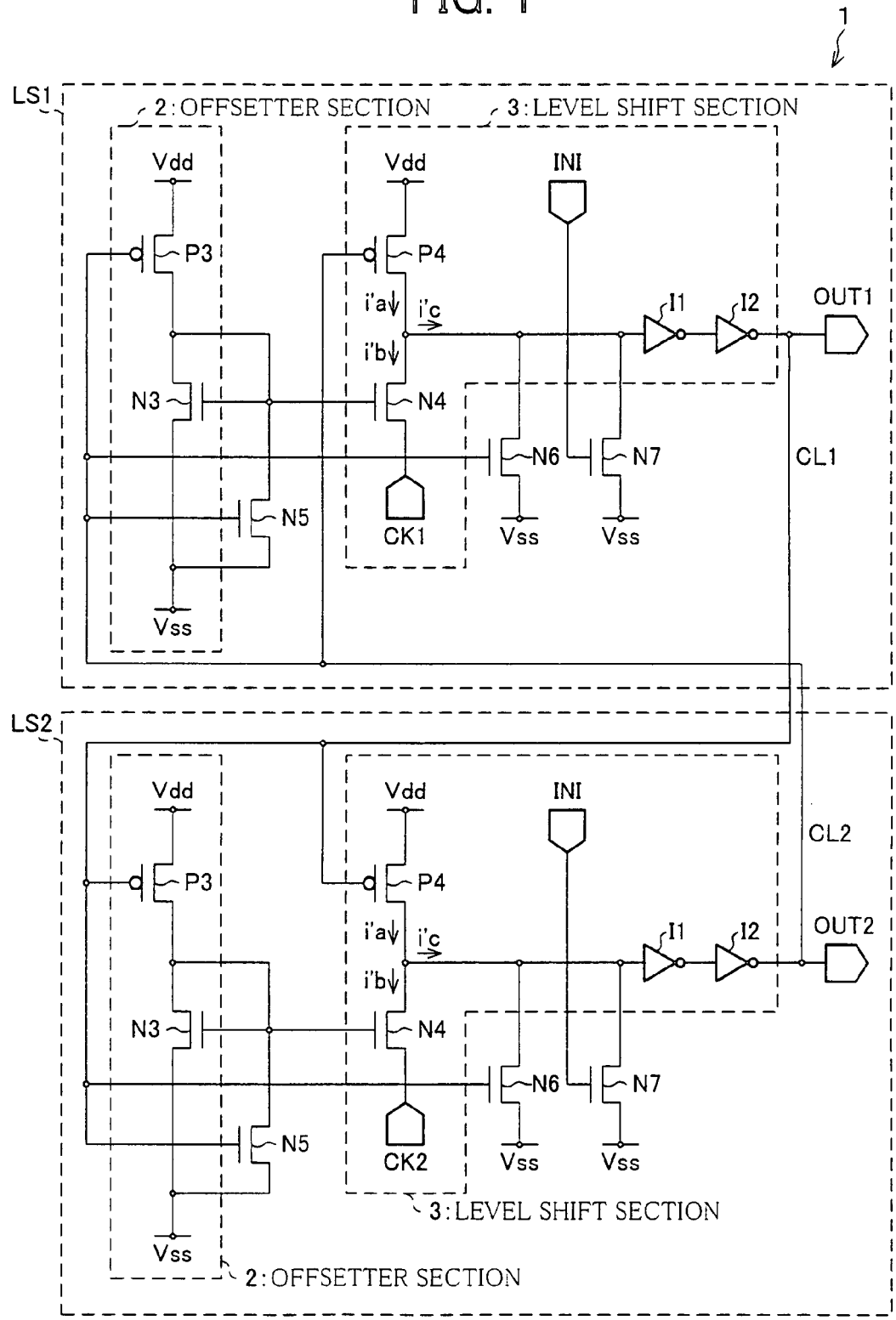
FIG. 1 is a circuit diagram showing a structure of a level shifter circuit of a First Embodiment according to the present invention.
Figure 2:
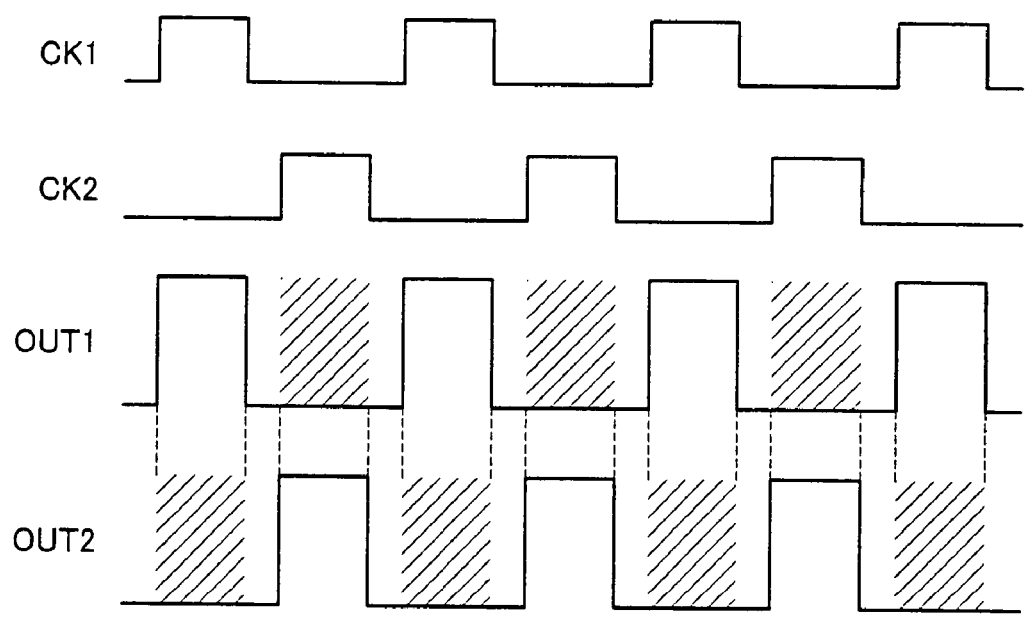
FIG. 2 is a timing chart showing clock signals supplied to the level shifter circuit of FIG. 1, and signals that are produced by level shifting of the clock signals.

The following describes one embodiment of the present invention with reference to FIG. 1 and FIG. 2.

FIG. 1 shows a structure of a level shifter circuit 1 of the present embodiment. The level shifter circuit 1 includes level shifters LS1 and LS2. In order to operate a circuit of the next stage, the level shifter LS1 raises a high level of a clock signal CK1 as shown in FIG. 2 to the level (high level) of a driving voltage Vdd, which is a power voltage used to drive the next stage circuit, the high level of the clock signal CK1 being lower than the driving voltage Vdd. The level shifter LS1 then outputs the clock signal CK1 as an output signal OUT1.

In the same manner, in order to operate the next stage circuit, the level shifter LS2 raises a high level of a clock signal CK2 as shown in FIG. 2 to the level of the driving voltage Vdd, the high level of the clock signal CK2 being lower than the level of the driving voltage Vdd. The level shifter LS2 then outputs the clock signal CK2 as an output signal OUT2.

The clock signals CK1 and CK2 are out of phase with each other, so that their high level periods do not overlap. The high level period is an active period in which the next stage circuit is operated. The low level period is a non-active period in which the next stage circuit is disabled.

The level shifters LS1 and LS2 each include an offsetter section 2, a level shift section 3, a control transistor N5, a driving transistor N6, and an initializing transistor N7. The level shifter circuit 1 as a whole includes control lines CL1 and CL2. The control transistors N5 and the control lines CL1 and CL2 make up level shifting control means.

Each offsetter section 2 of the level shifters LS1 and LS2 has a constant current source transistor P3 and an N-channel MOS transistor N3 ("transistor N3" hereinafter).

The constant current source transistor P3 is realized by a P-channel MOS transistor, whose source is connected to a power line of the driving voltage Vdd, and drain is connected to the drain of the transistor N3. The gate of the transistor P3 in the level shifter LS1 is connected to an output terminal of the level shifter LS2. The gate of the transistor P3 in the level shifter LS2 is connected to an output terminal of the level shifter LS1.

The source of the transistor N3 is connected to a power line of a power voltage Vss, and the gate of the transistor N3 is connected to its drain. The driving voltage Vdd is a high level voltage that is attained by level shifting, and the power voltage Vss is a low level voltage that is attained by level shifting.

Here, the clock signals CK1 and CK2 of a high level are only raised to the level of the driving voltage Vdd, and therefore the power voltage Vss is equal to the low levels of the clock signals CK1 and CK2.

Each level shift section 3 of the level shifters LS1 and LS2 has a constant current source transistor P4, N-channel MOS transistor N4 ("transistor N4" hereinafter), and inverters I1 and I2.

The constant current source transistor P4 is realized by a P-channel MOS transistor, whose source is connected to the power line of the driving voltage Vdd, and drain is connected to the drain of the transistor N4. The gate of the transistor P4 in the level shifter LS1 is connected to the output terminal of the level shifter LS2. The gate of the transistor P4 in the level shifter LS2 is connected to the output terminal of the level shifter LS1.

The source of the transistor N4 is connected to an input terminal of the clock signal CK1 in the level shifter LS1, and to an input terminal of the clock signal CK2 in the level shifter LS2.

The gate of the transistor N4 is connected to the gate of the transistor N3. The input terminal of the inverter I1 is connected to a junction of the drain of the constant current source transistor P4 and the drain of the transistor N4. The output terminal of the inverter I1 is connected to the input terminal of the inverter I2.

The output terminal of the inverter I2 is a terminal that outputs the output signal OUT1 in the level shifter LS1, and the output signal OUT2 in the level shifter LS2.

The control transistor N5 is realized by an N-channel MOS transistor, whose drain is connected to the gate and drain of the transistor N3, and to the gate of the transistor N4. The source of the control transistor N5 is connected to the line of the power voltage Vss.

The driving transistor N6 is realized by an N-channel MOS transistor, whose drain is connected to the drain of the constant current source transistor P4, to the drain of the transistor N4, and to the input terminal of the inverter I1. The source of the driving transistor N6 is connected to the line of the power voltage Vss. The gate of the transistor N6 in the level shifter LS1 is connected to the output terminal of the level shifter LS2. The gate of the transistor N6 in the level shifter LS2 is connected to the output terminal of the level shifter LS1.

The initializing transistor N7 is realized by an N-channel MOS transistor, whose drain is connected to the drain of the constant current source transistor P4, to the drain of the transistor N4, and to the input terminal of the inverter I1. The source of the initializing transistor N7 is connected to the line of the power voltage Vss. The gate of the initializing transistor N7 receives an initializing signal INI.

The control line CL1 connects the output terminal of the level shifter LS1 to the respective gates of the constant current source transistors P3 and P4, the control transistor N5, and the driving transistor N6 in the level shifter LS2. The control line CL2 connects the output terminal of the level shifter LS2 to the respective gates of the constant current source transistors P3 and P4, the control transistor N5, and the driving transistor N6.

The level shifter circuit 1 operates as follows. It is assumed here that the voltage applied to the control line CL1 in the level shifter LS1 and the voltage applied to the control line CL2 in the level shifter LS2 are both at low level. In the following, the operations of the level shifter LS1 and the level shifter LS2 will be described together.

When the voltage applied to the control line CL1, CL2 is at low level, the constant current source transistor P3 of the offsetter section 2 conducts and serves as a constant current source. Thus, in the offsetter section 2, an intermediate voltage of the driving voltage Vdd and the power voltage Vss is supplied to the gate of the transistor N3 as a level shifting voltage. This voltage will be referred to as offset voltage.

The offset voltage, under a steady state, is slightly higher than the threshold voltage Vth of the transistor N3 or the threshold voltage Vth. This causes the transistor N3 to conduct. Here, because the voltage applied to the control line CL1, CL2 is at low level, the control transistor N5 does not conduct.

In the level shift section 3, when the voltage applied to the control line CL1, CL2 is at low level, the constant current source transistor P4 of the level shift section 3 conducts and serves as a constant current source. Here, because the voltage applied to the control line CK1, CK2 is at low level, the driving transistor N6 does not conduct.

The constant current source transistor P4 flows a constant current i'a. The constant current i'a flows into a junction of the drain of the constant current source transistor P4 and the input terminal of the inverter I1, which direction of current flow is denoted as positive. The transistor N4 flows a current i'b into the input terminal of the clock signal CK1 in the level shifter LS1 and into the input terminal of the clock signal CK2 in the level shifter LS2. The direction of this current flow is denoted as positive. A current that flows into the inverter I1 from the junction of the drain of the constant current source transistor P4 and the input terminal of the inverter I1 is a current i'c, which direction of current flow is denoted as positive.

The offset voltage from the offsetter section 2 is applied to the gate of the transistor N4, which has essentially the same characteristics as the transistor N3. Therefore, the voltage applied to the gate of the transistor N4 is slightly higher than the threshold voltage Vth of the transistor N4 or the threshold voltage Vth.

The voltage of the clock signal CK1, CK2 is applied to the source of the transistor N4, which enables the current flow through the transistor N4 to be controlled with respect to small changes in voltage level of the clock signal CK1, CK2.

When the clock signals CK1, CK2 are at low voltage level, the potential difference across the gate and source of the transistor N4 is slightly greater than the threshold voltage Vth of the transistor N4 or the threshold voltage Vth, and the transistor N4 conducts. Under a conducting state of the transistor N4, the constant current i'a flows into the terminal of the clock signal CK1 and CK2 that is supplied to the source of the transistor N4 (feedthrough current).

Here, the current i'c, which flows into the inverter I1 from the junction of the drain of the constant current source transistor P4 and the input terminal of the inverter I1 (positive direction), becomes a pull current that flows into the terminal of the clock signal CK1, CK2 that is supplied to the source of the transistor N4. Thus, the current i'c is negative in this case.

As a result, the stored charge at the gate of a MOS transistor in the inverter I1 is released to cause a potential drop. When the voltage decreases below the theoretical inverting voltage of the inverter I1, the inverter I1 outputs the driving voltage Vdd to the input terminal of the inverter I2. As a result, the output signal OUT1, OUT2 of the inverter I2 becomes the power voltage Vss (low level of the clock signals CK1 and CK2).

In this manner, by level shifting, the level shifters LS1 and LS2 convert the low levels of the clock signals CK1 and CK2 to the power voltage Vss, which is a low level of a predetermined power voltage.

The level shifting during the low level period, i.e., the non-active period of the clock signals CK1 and CK2 is carried out using a voltage that is generated at the junction of the drain of the constant current source transistor P4 and the drain of the transistor N4 by flowing a constant feedthrough current through the series circuit of the constant current source transistor P3 and the transistor N3 in the offsetter section 2, and through the series circuit of the constant current source transistor P4 and the transistor N4 in the level shift section 3.

On the other hand, when the clock signals CK1 and CK2 are at high voltage level, the potential difference across the gate and source of the transistor N4 becomes smaller than the threshold voltage Vth of the transistor N4. This reduces the current i'b through the transistor N4 to zero, or only a small amount of current i'b flows therethrough, if any.

As a result, the constant current i'a through the junction of the drain of the constant current source transistor P4 and the input terminal of the inverter I1 flows into the input terminal of the inverter I1 almost completely. Thus, in this case, the current i'c is positive. In response, positive charges accumulate at the gate of the MOS transistor in the inverter I1, thereby increasing the gate voltage of the MOS transistor.

When the gate voltage of the MOS transistor exceeds the theoretical inverting voltage of the inverter I1, the inverter I1 outputs the power voltage Vss to the input terminal of the inverter I2. The inverter I2, in response, outputs the driving voltage Vdd. In this manner, the high voltage level of the clock signal CK1 and CK2, which is lower than the driving voltage Vdd, is raised to the driving voltage Vdd, so as to generate the output voltage OUT1, OUT2.

In this manner, by level shifting, the level shifters LS1 and LS2 convert the high levels of the clock signals CK1 and CK2 to the driving voltage Vdd, which is a high level of a predetermined power voltage.

The following describes the case where the voltage applied to the control signal CL1 in the level shifter LS1 and the voltage applied to the control line CL2 in the level shifter LS2 are both at high level.

In the following, the operations of the level shifter LS1 and the level shifter LS2 will be described together. It should be noted that, in the present embodiment, when the voltage applied to one of the control lines CL1 and CL2 is at high level, the voltage applied to the other control line CL1 or CL2 is at low level.

When the voltage applied to the control line CL1, CL2 is at high level, the constant current source transistor P3 of the corresponding offsetter section 2 does not conduct and does not serve as a constant current source.

In this case, the constant current source transistor P4 of the level shifter 3 does not conduct either and does not serve as a constant current source. Because the input signal to the gate of the control transistor N5 is at high level, the control transistor N5 conducts and supplies the power voltage Vss to the gate of the transistor N3 in the offsetter section 2 and to the gate of the transistor N4 of the level shift section 3. This turns off the transistor N3 and the transistor N4.

As a result, the level shifting function of the level shifters LS1 and LS2 are suspended. Here, the constant current source transistor P3 and the transistor N3 of the offsetter section 2 are both off, and there exists no feedthrough current in the offsetter section 2.

Further, because the constant current source transistor P4 and the transistor N4 are off, the current i'b becomes substantially zero. That is, there is no feedthrough current in the level shift section 3.

When the voltage applied to the control signal CL1, CL2 in the level shifter LS1, LS2 is high level and the level shifting function of the level shifter LS1, LS2 is suspended, a high level is applied to the gate of the driving transistor N6, and accordingly the driving transistor N6 conducts.

As a result, the input voltage to the inverter I1 becomes the power voltage Vss. When the voltage is lower than the theoretical inverting voltage of the inverter I1, the inverter I1 outputs the driving voltage Vdd to the input terminal of the inverter I2. As a result, the output voltage of the inverter I2 becomes the power voltage Vss (low level of the clock signals CK1 and CK2), and the inverter I2 outputs the output signal OUT1, OUT2 of the power voltage Vss.

The following describes a state change of the level shifters LS1 and LS2 before and after the input of the clock signals CK1 and CK2. The description will be given through the case where the two kinds of clock signals CK1 and CK2, having non-overlapping high level periods below the driving voltage Vdd, shown in FIG. 2, are applied after the level shifters LS1 and LS2 have attained a stable state from an unstable initial state.

The duty of the high level period of the clock signals CK1 and CK2 is below (100×0.5) %. First, in order to stabilize the level shifter LS1, LS2, an initializing signal IN1 of the driving voltage Vdd is applied to the gate of the initializing transistor N7 in an unstable initial state of the level shifter LS1, LS2. This turns on the initializing transistor N7. As a result, the input voltage of the inverter I1 becomes the power voltage Vss. When the voltage is below the theoretical inverting voltage of the inverter I1, the inverter I1 outputs the driving voltage Vdd to the input terminal of the inverter I2.

As a result, the output voltage of the inverter I2 becomes the power voltage Vss (low level of the clock signals CK1 and CK2), and the inverter I2 outputs the output signal OUT1 of the power voltage Vss in the level shifter LS1, and the output signal OUT2 of the power voltage Vss in the level shifter LS2.

The initializing signal INI of the driving voltage Vdd is supplied until the output signals OUT1 and OUT2 of the level shifters LS1 and LS2 both become the power voltage Vss. Once a normal state is attained, the initializing signal INI of the power voltage Vss is supplied to the gate of the initializing transistor N7 at all times.

Thus, the initializing transistor N7 does not conduct in a normal state. The signal supplied to the input terminal of the clock signal CK1, CK2 is at low level while the initializing signal INI is at the driving voltage Vdd.

This is to prevent a potential problem which may be caused when the high level signal is applied to the input terminal of the clock signal CK1, CK2 while the initializing signal INI is at the driving voltage Vdd. In this case, the transistor N4 in the level shift section 3 does not conduct, and the current i'c which flows into the inverter I1 from the junction of the drain of the constant current source transistor P4 and the input terminal of the inverter I1 becomes positive. This is not desirable because it might prevent the power voltage Vss from being supplied from the initializing transistor N7 to the gate of the MOS transistor making up the inverter I1.

Because the output signals OUT1 and OUT2 are both at low level, the signals supplied to the control lines CL1 and CL2 are also at low level. As a result, the constant current source transistor P3 of the offsetter section 2 and the constant current source transistor P4 of the level shift section 3 conduct in the level shifters LS1 and LS2. Here, the level shifters LS1 and LS2 are both in a non-active state.

When the clock signal CK1 of a high level lower than the driving voltage Vdd, and the clock signal CK2 of a low level are supplied where the output signals OUT1 and OUT2 are at the driving voltage Vss (low level), the level shifter LS1 which has received the clock signal CK1 through the level shift section 3 outputs the output signal OUT1 which was produced by raising the clock signal CK1 to the driving voltage Vdd.

When the output signal OUT1 becomes high level, the signal supplied to the control line CL1 also becomes high level. Accordingly, the constant current source transistor P3 of the offsetter section 2 and the constant current source transistor P4 of the level shift section 3 do not conduct.

Further, the control transistor N5 of the level shifter LS2 conducts, and accordingly the transistor N3 of the offsetter section 2 and the transistor N4 of the level shift section 3 in the level shifter LS1 are turned off. As a result, the level shifting function of the level shifter LS2 is suspended, and essentially no feedthrough current flows through the level shifter LS2.

Here, the transistor N6 is on, and the input terminal of the inverter I1 is connected to the power voltage Vss via the transistor N6 (active pull-down). As a result, the output signal OUT2 of the shift register LS2 maintains low level.

Here, because the output signal OUT2 is at low level, the voltage applied to the control line CL2 is also low level. This enables the level shifting function of the level shifter LS1 during the input period of the clock signal CK1 of a high level. That is, the level shifting function of the level shifter LS1 is active during period.

When the clock signal CK1 is at low level, the output signal OUT1 of the level shifter LS1 becomes low level. The output signal OUT1 of a low level causes the applied voltage to the control line CL1 to be low level. This turns on the constant current source transistor P3 of the offsetter section 2 and the constant current source transistor P4 of the level shift section 3 in the level shifter LS2. As a result, the level shifting function of the level shifter LS2 becomes active, thereby enabling level shifting.

Immediately after the clock signal CK1 has become low level, the clock signal CK2 is also at low level, and accordingly the output signal OUT2 of the level shifter LS2 in an active state is at low level. Here, the level shifters LS1 and LS2 are both active.

Subsequently, when the clock signal CK2 of a high level lower than the driving signal Vdd is supplied to the level shift section 3 of the level shifter LS2, the level shifter LS2 outputs the output signal OUT2 which was produced by raising the clock signal CK2 to the driving voltage Vdd.

When the output signal OUT2 is at high level, the voltage applied to the control line CL2 also becomes high level. This turns off the constant current source transistor P3 of the offsetter section 2 and the constant current source transistor P4 of the level shift section 3 in the level shifter LS1.

Further, the control transistor N5 of the level shifter LS1 is on, and the transistor N3 of the offsetter section 2 and the transistor N4 of the level shift section 3 are off. As a result, the level shifting function of the level shifter LS1 is suspended, and essentially no feedthrough current flows through the level shifter LS1.

Here, the driving transistor N6 of the level shifter LS1 is on, and the input terminal of the inverter I1 is connected to the power voltage Vss via the driving transistor N6 (active pull-down). As a result, the output signal OUT1 of the shift register LS1 becomes low level.

Here, the output signal OUT1 is low level, and accordingly the applied voltage to the control line CL1 is also at low level. This activates the level shifting function of the level shifter LS2 during the input period of the clock signal CK2 of a high level.

When the clock signal CK2 is at low level, the output signal OUT2 of the level shifter LS2 also becomes low level. The output signal OUT2 of a low level causes the applied voltage to the control line CL2 to be low level. This turns on the constant current source transistor P3 of the offsetter section 2 and the constant current source transistor P4 of the level shift section 3 in the level shifter LS1. As a result, the level shifting function of the level shifter LS1 becomes active, thereby enabling level shifting.

Immediately after the clock signal CK2 has become low level, the clock signal CK1 is also at low level, and accordingly the output signal OUT1 of the level shifter LS1 in an active state is at low level. Here, the level shifting function of the level shifters LS1 and LS2 has returned to the active state again.

In the manner described above, the level shifting control means that is realized by the control transistors N5 and the control lines CL1, CL2 of the level shifters LS1, LS2 suspends the operation of level shifting by preventing the feedthrough current from flowing into the series circuit of the constant current source transistor P3 and the transistor N3 of the offsetter section 2, and into the series circuit of the constant current source transistor P4 and the transistor N4 of the level shift section 3, during a specific time period in the non-active period of the clock signal CK1, CK2, where the specific time period corresponds to the active period of the other clock signal CK2, CK1.

This procedure is repeated in the manner shown in the timing chart of FIG. 2, so as to output the output signals OUT1 and OUT2, which are produced by raising the high levels of the clock signals CK1 and CK2, whose high levels are lower than the driving voltage Vdd, to the power voltage Vdd. The hatched portion in the timing chart of FIG. 2 indicate time periods in which the level shifting of the level shifter LS1, LS2 is suspended while the other level shifter LS1, LS2 outputs the output signal OUT1, OUT2.

The level shifting of one of the level shifters LS1 and LS2 is suspended while the other level shifter LS1, LS2 outputs the high level signal. It is therefore possible, in the non-active period in which no level shifting into a different level is carried out, to reduce the power dissipation due to the channel resistance or wire resistance of the MOS transistor caused by the feedthrough current in the offsetter section 2 and the level shift section 3, which accounts for much of power dissipation. As a result, the power dissipation of the level shifter circuit 1 can be significantly reduced.

Note that, the foregoing embodiment described the case where two kinds of clock signals CK1 and CK2 are out of phase with each other so that their high level periods do not overlap. However, the present invention is not just limited to this, and the technical idea of the present invention is also applicable to two kinds of clock signals whose low level periods do not overlap, or even two kinds of clock signals having non-overlapping low level periods and non-overlapping high level periods.

Further, the foregoing embodiment described the case where the level shifters LS1 and LS2 level shift and output the clock signals CK1 and CK2 without inversion. However, the level shifters LS1 and LS2 may level shift and invert the clock signals CK1 and CK2 before they are outputted.

It should be appreciated that the technical idea of the present invention is also applicable to this case because the high level or low level of the clock signal is level shifted to the high level or low level of the power voltage also in this case.

Thus, generally, any type of level shifter may be used, provided that it is provided per clock signal and it carries out the level shifting of converting a high level of the clock signal to either a high level or low level of a predetermined power voltage, and converting a low level of the clock signal to the other level of the predetermined power voltage. This is true for all of the embodiments described below.

Further, in a specific time period in a non-active period of the clock signal CK1, CK2, which specific time period corresponds to the active period of the other clock signal CK2, CK1, the level shifter LS1, LS2 of the level shifter circuit 1 generates and outputs a non-active level (power voltage Vss)

that is different from the level of the clock signal (power voltage Vss) resulting from the level shifting, using an alternative voltage that is generated by pull-up or pull-down to the power voltage Vss, instead of using the voltage that is generated by flowing the constant current through the offsetter section 2 and the level shift section 3.

Here, the non-active level is described as the power voltage Vss. However, any level may be used so long as it does not operate the next stage circuit of the level shifter circuit 1. Further, even when the alternative voltage is generated by the active pull-up to the driving voltage Vdd, the same non-active level may be produced by increasing the number of inverter stages.

In the foregoing configuration, instead of the feedthrough current, a charge/discharge current with respect to the gate of the input-stage MOS transistor of the inverter I1 is flown, and accordingly the only current is the charge/discharge current at the gate of the MOS transistor due to switching of the MOS transistor. As a result, a voltage level for a non-active period can always be obtained at low power consumption.

Further, the foregoing used an active element such as the driving transistor N6 for the active pull-up or active pull-down. However, instead of the active element, a resistor having a large resistance may be used to carry out pull up to the driving voltage Vdd or pull down to the power voltage Vss. The same effect can be obtained in this case.

Further, in the level shifter circuit 1, the duty of the non-overlapping high level period of the clock signals CK1 and CK2 is less than (100×0.5) %, and as such the high level periods of the two kinds of clock signals CK1 and CK2 never overlap, enabling the active periods of the clock signals CK1 and CK2 to be freely selected, as required, to carry out level shifting. The same effect can also be obtained when the two kinds of clock signals have non-overlapping low level periods whose duty is less than (100×0.5) %.

Further, in the level shifter circuit 1, the level shifter LS1, LS2 includes a step-up section of a switching MOS transistor structure, which is provided as a circuit that flows the feedthrough current in the offsetter section 2 and the level shift section 3. The step-up section is comprised of the transistor N4 as a MOS transistor whose source receives the clock signal CK1, CK2.

The step-up section is of a current driving type, by which the current is flown throughout the level shifting of the level shifters LS1 and LS2, so as to raise the high levels of the clock signals CK1 and CK2 to the driving voltage Vdd, which is a high level of the power voltage.

The provision of the step-up section allows for level shifting of the clock signal CK1, CK2 whose amplitude is smaller than the potential difference across the high level (driving voltage Vdd) and the low level (power voltage Vss) of the power voltage, only in the active period of the clock signal CK1, CK2, even when the threshold of the transistor N4 is greater than the amplitude of the clock signal CK1, CK2 and the characteristics of the MOS transistor are relatively poor.

The effect of providing the step-up section can also be obtained by providing a step-down section which lowers the low level of the clock signal to the low level of the power voltage, or by providing both the step-up section and the step-down section.

Further, in the level shifter circuit 1, the non-overlapping high level periods of the clock signals CK1 and CK2 are active periods of the clock signals CK1 and CK2, and the time period in which the level shifter LS1, LS2 suspends the level shifting of the clock signal CK1, CK2 corresponds to the active period of the other clock signal CK2, CK1.

Thus, during this period, only the level shifter that has received the high level clock signal carries out level shifting. This enables the level shifting control means, which is realized by the control transistors N5 and the control lines CL1, CL2, to use the output signal OUT1, OUT2, which results from the level shifting of the clock signal CK1, CK2 in the active period, as a signal that suspends the level shifting of the other level shifter LS2, LS1.

Second Embodiment

Another embodiment of the present embodiment is described below with reference to FIG. 3. Unless noted otherwise, members having analogous functions as those described in the foregoing First Embodiment are given the same reference numerals and explanations thereof are omitted here.

Figure 3:
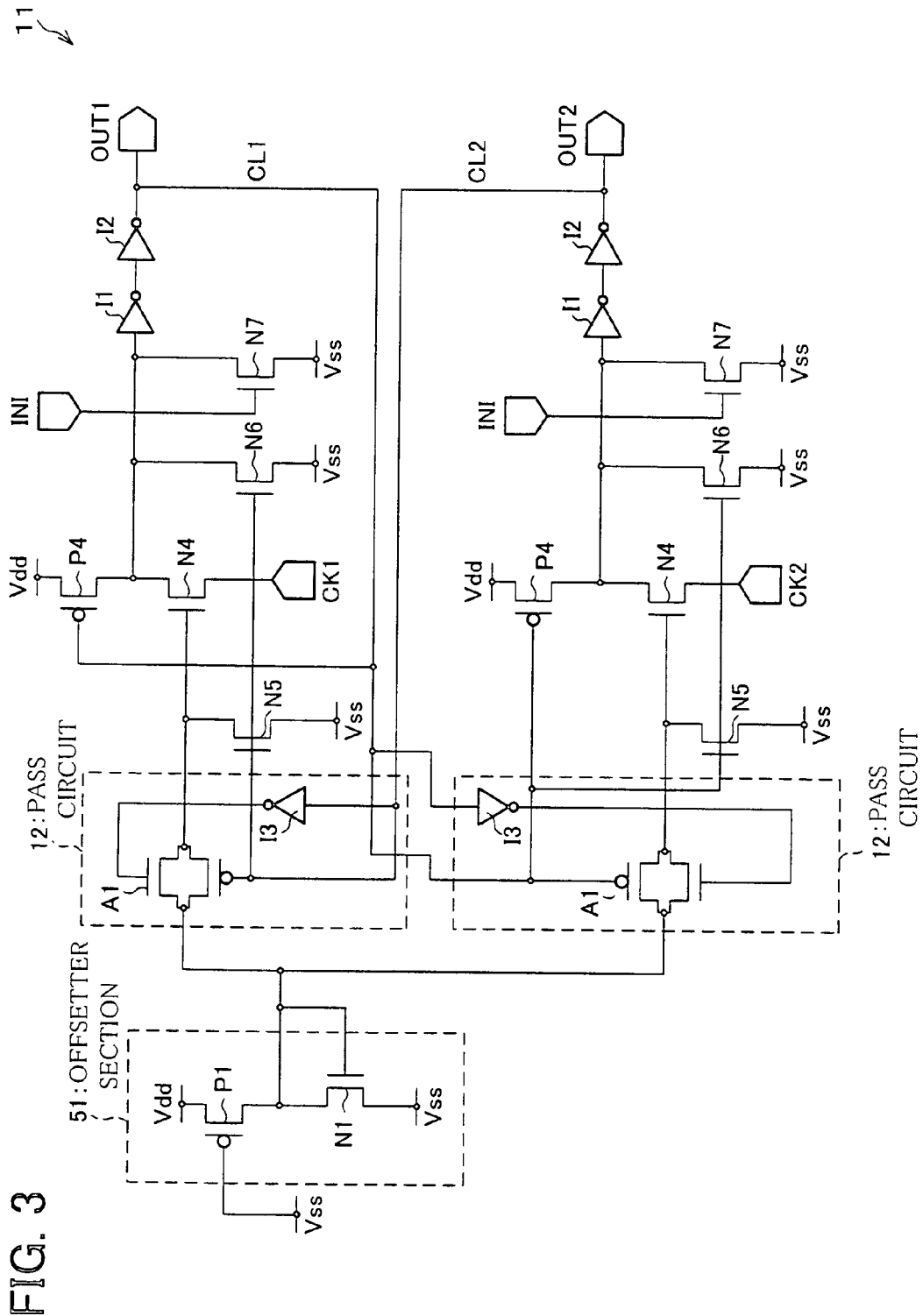
FIG. 3 is a circuit diagram showing a structure of a level shifter circuit of a Second Embodiment according to the present invention.

FIG. 3 shows a structure of a level shifter circuit 11 of the present embodiment. Instead of the two offsetter sections 2 in the level shifter circuit 1 shown in FIG. 1, the level shifter circuit 11 includes a single offsetter section 51. In addition, the level shifter circuit 11 includes a pass circuit 12 for each of the level shifters LS1 and LS2. The control lines CL1 and CL2 connect these and other circuit elements slightly differently from that shown in FIG. 1, as described below.

The offsetter section 51 is common to the level shifters LS1 and LS2, and a feedthrough current is flown through the series circuit of the constant current source transistor P1 and the transistor N1 at all times. The pass circuit 12 is provided to connect or disconnect the gate of the transistor N1 of the offsetter section 51, the gate of the transistor N4 of the level shift section 3, and the drain of the control transistor N5 of the level shifter section 3. The pass circuit 12 includes an analog switch A1 and an inverter I3.

The analog switch A1 is realized by a P-channel MOS transistor and an N-channel MOS transistor. One terminal of the analog switch A1 is connected to the gate of the transistor N1, and the other terminal is connected to the gate of the transistor N4 and to the drain of the control transistor N5.

The gate of the N-channel MOS transistor of the analog switch A1 is connected to the output terminal of the inverter I3. The control line CL1 connects the output terminal of the level shifter LS1 to the respective gates of the control transistor N5, the driving transistor N6, and the P-channel MOS transistor of the analog switch A1 of the level shifter LS2, and to the input terminal of the inverter I3 of the level shifter LS2.

The control line CL2 connects the output terminal of the level shifter LS2 to the respective gates of the control transistor N5, the driving transistor N6, and the P-channel MOS transistor of the analog switch A1 of the level shifter LS1, and to the input terminal of the inverter A3 of the level shifter LS1.

When the voltage of the output signal OUT1, OUT2 applied to the control line CL1, CL2 is low level, the analog switch A1 connected to the control line CL1, CL2 conducts the offset voltage of the offsetter section 51 to the gate of the transistor N4 of the level shift circuit 3.

On the other hand, when the voltage of the output signal OUT1, OUT2 applied to the control line CL1, CL2 is high level, the analog switch A1 connected to the control line CL1, CL1 disconnects the offset voltage of the offsetter section 51 from the gate of the transistor N4 of the level shift circuit 3, so as to prevent the low level signal, which is sent from the drain of the control transistor N5 to the gate of the transistor N4, from being transmitted to the offsetter section 51.

That is, in the present embodiment, the level shifting control means is realized by the control transistors N5, the control lines CL1, CL2, and the pass circuits 12.

In the level shifter 11, the feedthrough current is prevented from flowing through the series circuit of the constant current source transistor P4 and the transistor N4 in the level shift section 3 during a specific time period in the non-active period of the clock signal CK1, CK2, where the specific time period is the active period of the other clock signal CK2, CK1.

As a result, the power dissipation, which would have been caused by the feedthrough current, can be eliminated. Further, the feedthrough current that flows the common offsetter section 51 exists only for the level shifter carrying out the level shifting. To put it in reverse, the feedthrough current in the offsetter section 51 is eliminated with respect to the level shifter that is not carrying out the level shifting, thereby also reducing power consumption by this amount.

In the foregoing configuration, the offsetter section 51 which generates and outputs the offset voltage irrespective of whether the clock signal is in a specific time period or not is commonly provided for the level shifters LS1 and LS2. This simplifies the circuit structure and reduces power consumption.

Further, in the case where the level shifter circuit 11 has a peripheral circuit that uses the output voltage of the offsetter section 51, the voltage may be shared by such a peripheral circuit and the offsetter section 51. In this way, it is also possible to simplify the circuit structure and reduce power consumption.

Third Embodiment

Yet another embodiment of the present invention is described below with reference to FIG. 4 through FIG. 6. Unless noted otherwise, members having analogous functions to those described in the foregoing First and Second Embodiments are given the same reference numerals and explanations thereof are omitted here.

Figure 4:
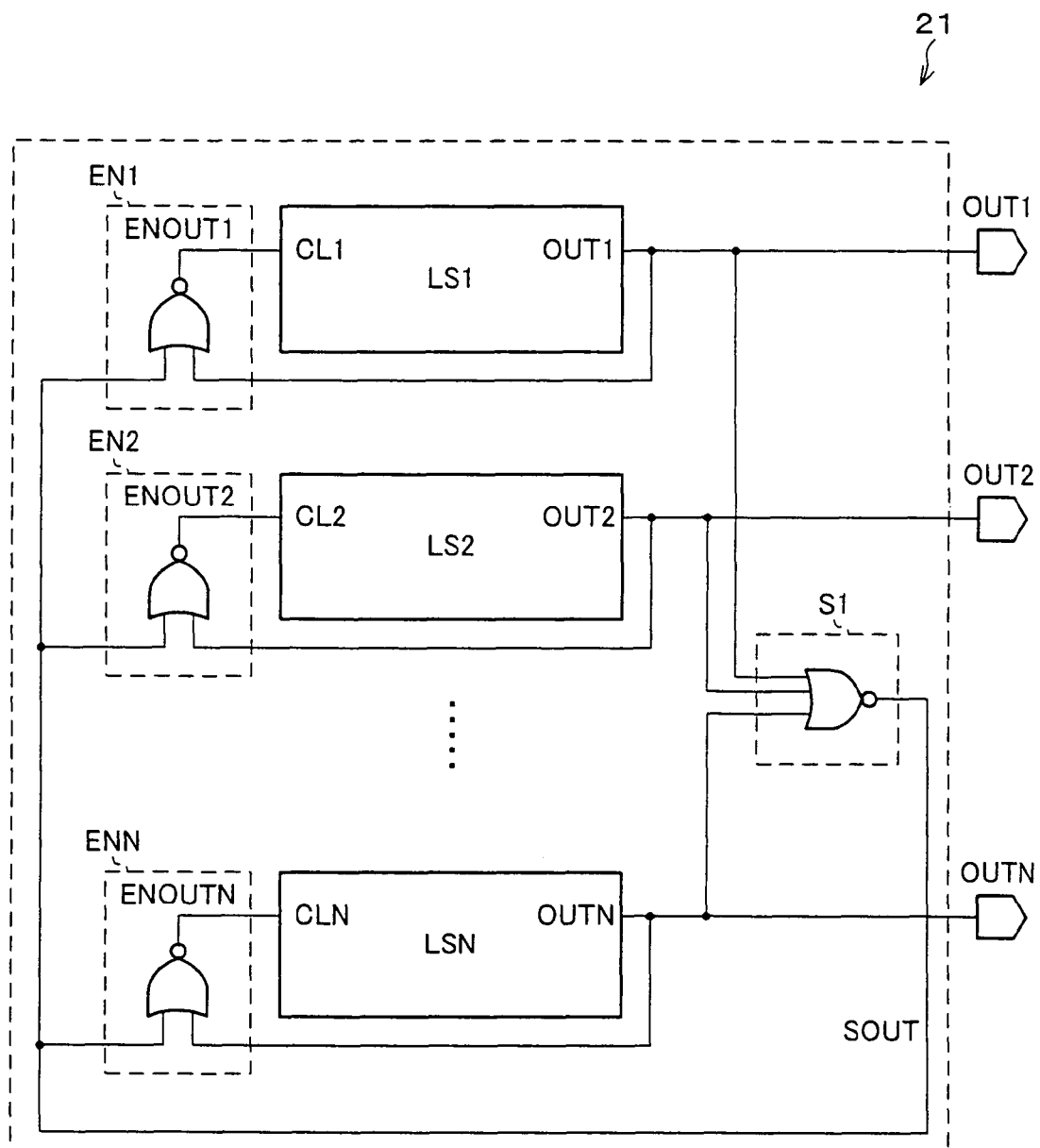
FIG. 4 is a circuit block diagram showing a structure of a level shifter circuit of a Third Embodiment according to the present invention.

FIG. 4 shows a structure of a level shifter circuit 21 of the present embodiment. The level shifter circuit 21 includes level shifters LS1, LS2, . . . , LSN, an active period presence detecting circuit S1, and active period detecting circuits EN1, EN2, . . . , ENN.

N is an integer of not less than 2, and the level shifters LS1, LS2, LSN level shift clock signals CK1, CK2, . . . , CKN, respectively. Each level shifter LSn ($1 \leq n \leq N$; this range of n will be used throughout the description that follows) has a structure shown in FIG. 5.

Figure 6:
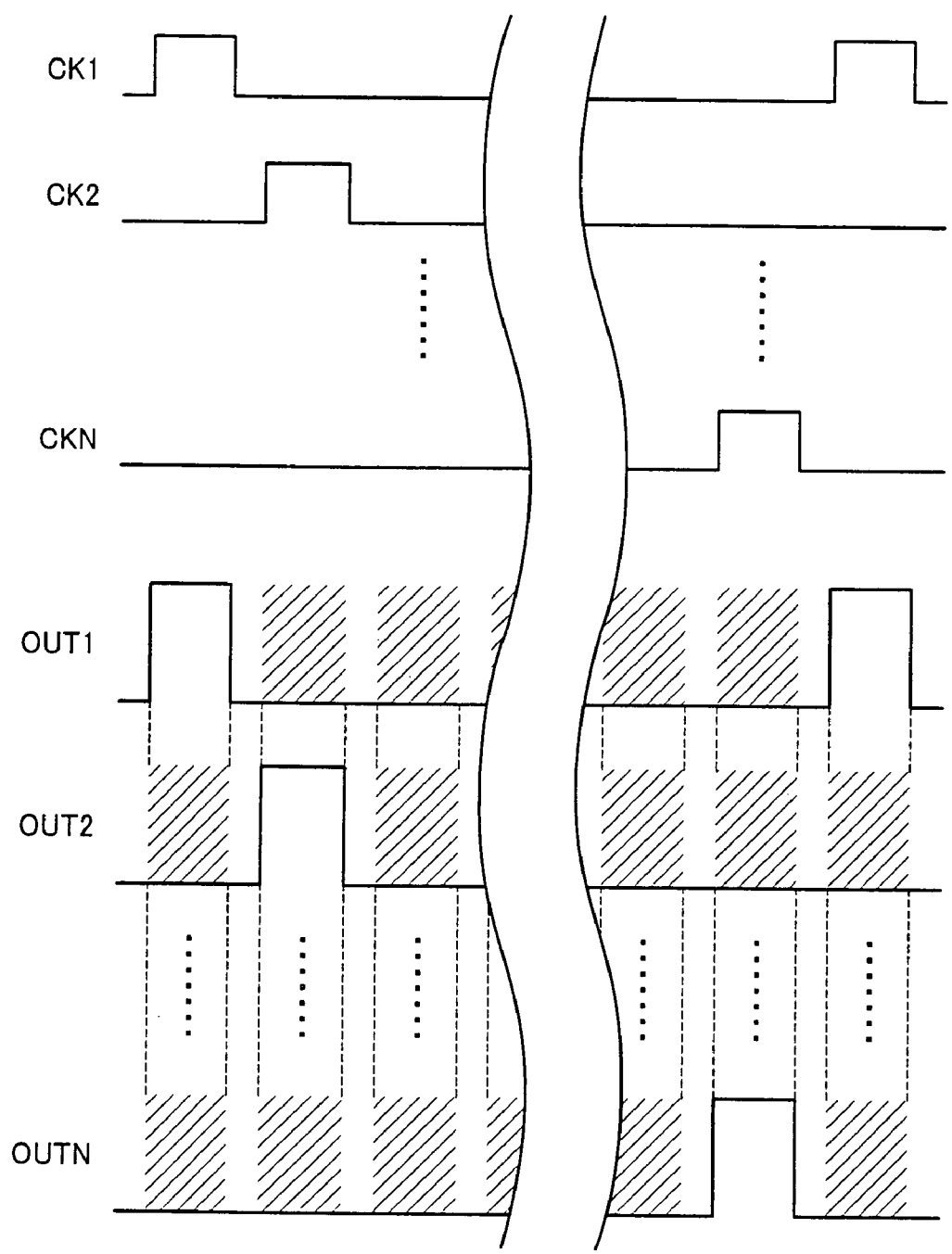
FIG. 6 is a timing chart showing clock signals that are supplied to the level shifter circuit of FIG. 4, and signals that are produced by level shifting of the clock signals.

In order to operate the circuit of the next stage, the level shifter LSn raises a high level of a clock signal CKn as shown in FIG. 6 to the level of a driving voltage Vdd which drives the next stage circuit, the high level of the clock signal CKn being lower than the driving voltage Vdd. The level shifter LSn then outputs the clock signal CKn as an output signal OUTn. The clock signals CK1, CK2, . . . , CKN are out of phase with one another so that their high level periods do not overlap.

The high level period is an active period in which the next stage circuit is operated. The low level period is a non-active period in which the next stage circuit is disabled.

Figure 5:
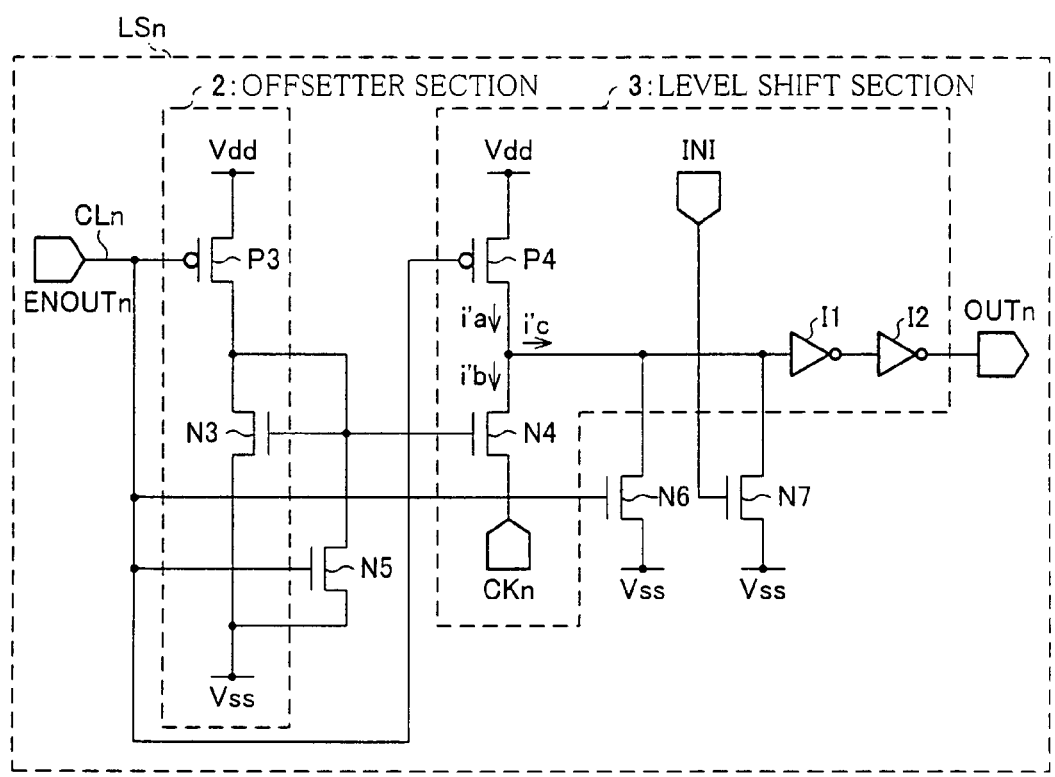
FIG. 5 is a circuit diagram showing a structure of one level shifter provided in the level shifter circuit of FIG. 4.

The level shifter LSn shown in FIG. 5 includes the offsetter section 2, the level shift section 3, the control transistor N5, the driving transistor N6, and the initializing transistor N7 as shown in FIG. 1. The level shifter LSn additionally includes a control line CLn, which is distinct to the present embodiment.

The control line CLn connects the respective gates of the constant current transistor P3, the transistor N4, the control transistor N5, and the driving transistor N6 to the output terminal of the active period detecting circuit ENn.

The active period presence detecting circuit S1 is realized by a NOR circuit, which receives output signals OUT1, OUT2, . . . , OUTN of the level shifters LS1, LS2, . . . , LSN, and outputs a signal SOUT.

The signal SOUT becomes low level only in the presence of the high level of the output signal OUTn, i.e., only when there is an active period. The active period detecting circuit ENn is realized by a NOR gate, which receives the signal SOUT of the active period presence detecting circuit S1 and the output signal OUTn of the level shifter LSn, and outputs a signal ENOUTn to the control line CLn.

Under the condition where the high level period of the clock signal CKn is the active period, the clock signal CKn supplied to the level shifter LSn is detected to be active when the signal ENOUTn is at low level, and non-active when the signal ENOUTn is at high level.

The active period presence detecting circuit S1, together with the active period detecting circuits EN1, EN2, . . . , ENN, make up active period detecting means for detecting whether the clock signal CKn of the level shifter LSn is in the active period or non-active period.

Further, the control transistors N5 and the control lines CLn as a whole make up level shifting control means for suspending the operating of level shifting by preventing the constant current from flowing into a predetermined circuit, as in the First Embodiment, during a specific time period in the non-active period as detected by the active period detecting means.

The following describes the operation of the level shifter circuit 21. Assuming that the high level period of the clock signal CKn is the active period, in response to the output signal OUTn of a high level outputted by any of the level shifters LSn, the active period presence detecting circuit S1, being a NOR circuit, outputs the signal SOUT of a low level.

The signal SOUT of a low level is supplied to the active period detecting circuit ENn. The two inputs of the corresponding active period detecting circuit ENn of the level shifter LSn which outputs the output signal OUTn of a low level are both low level, and accordingly the signal ENOUTn of the active period detecting circuit ENn becomes high level. Because the voltage applied to the control line CLn of the level shifter LSn is at high level, the level shifting function of the level shifter LSn is suspended.

The two inputs of the corresponding active period detecting circuit ENn of the level shifter LSn which outputs the output signal OUTn of a high level are high level and low level, and accordingly the signal ENOUTn of the active period detecting circuit ENn becomes low level.

Because the voltage applied to the control line CLn of the level shifter LSn is at low level, the level shifting function of the level shifter LSn is active. That is, only the level shifter LSn which outputs the output signal OUTn of a high level is active, and the level shifting function of the level shifter LSn which outputs the output signal OUTn of a low level is suspended.

Considering the case where the output signals OUTn of the level shifters LSn are all at low level, the active period presence detecting circuit S1, being a NOR circuit, outputs the signal SOUT of a low level. The signal SOUT of a high level is supplied to the active period detecting circuit ENn.

The active period detecting circuit ENn, being an NOR circuit, outputs the signal ENOUTn of a low level when the input is high level. Because the voltage applied to the control line CLn of the level shifter LSn is at low level, the level shifting functions of all level shifters LSn becomes active. That is, all the level shifters LSn are active when the output signals OUTn of all the level shifters LSn are at low level.

The following describes a state change of the level shifter LSn before and after the input of the clock signal CKn. The description will be given through the case where N kinds of clock signals CKn whose high level period duty is below (100×1/N) %, as shown in FIG. 6, are applied after the level shifters LSn have attained a stable state from an unstable initial state.

First, an initializing signal INI of the driving voltage Vdd is applied in an unstable initial state of the level shifters LSn. Here, the initializing signal INI is supplied to the gate of the initializing transistor N7, and accordingly the initializing transistor N7 conducts.

As a result, the input voltage of the inverter I1 becomes the power voltage Vss. If the voltage falls below the theoretical inverting voltage of the inverter I1, the inverter I1 outputs the driving voltage Vdd to the input terminal of the inverter I2. As a result, the output signal OUTn of the inverter I2 becomes the power voltage Vss (low level of the clock signal CKn).

The initializing signal INI of the driving voltage Vdd is supplied until all the output signals OUTn of the level shifters LSn become the power voltage Vss. Once the normal state is attained, the initializing signal INI of the power voltage Vss is supplied at all times. Accordingly, the initializing transistor N7 does not conduct in a normal state.

The signals supplied to the input terminals of the clock signals CKn are at low level while the initializing signal INI is at the driving voltage Vdd. This is to prevent a potential problem which may be caused when high level signals are applied to the input terminals of the clock signals CKn while the initializing signal INI is at the driving voltage Vdd. In this case, the transistor N4 in the level shift section 3 does not conduct, and the current i'c which flows into the inverter I1 from the junction of the drain of the constant current source transistor P4 and the input terminal of the inverter I1 becomes positive. This is not desirable because it might prevent the power voltage Vss from being supplied from the initializing transistor N7 to the gate of the MOS transistor making up the inverter I1.

Because the output signals OUTn are all at low level, the signals ENOUTn of the active period detecting circuits ENn are also at low level. Accordingly, the voltages applied to the control lines CLn are all low level. As a result, the constant current source transistor P3 of the offsetter section 2 and the constant current source transistor P4 of the level shift section 3 of all the level shifters LSn conduct. Here, the level shifting function of all the level shifters LSn is active.

Under the condition where all output signals OUTn have the power voltage Vss of a low level, when the clock signal CK1 of a high level, which is lower than the driving voltage Vdd, is applied to the level shifter LS1 and when the clock signals CK2, CK3, . . . , CKN of a low level are applied to the level shifters LS2, LS3, . . . , LSN, respectively, the level shifter LS1 outputs the output signal OUT1 which was raised to the driving voltage Vdd.

When the output signal OUT1 is at high level, the active period presence detecting circuit S1 causes the active period detecting circuit EN1 to output the signal ENOUT1 of a low level. Accordingly, the voltage applied to the control line CL1 also becomes low level. As a result, the level shifting function of the level shifter LS1 is active while the output signal OUT1 is at high level.

Here, the respective signals ENOUT2, ENOUT3, . . . , ENOUTN of the active period detecting circuits EN2, EN3, . . . , ENN are at high level, and accordingly the level shifting functions of the levels shifters LS2, LS3, . . . , LNN are suspended. Accordingly, the output signals OUT2, OUT3, . . . , OUTN are at low level.

When the clock signal CK1 becomes low level, the output signal OUT1 of the level shifter LS1 also becomes low level. Because the output signals OUTn are all low level, the active period presence detecting circuit S1 causes the active period detecting circuit ENn to output the signal ENOUTn of a low level. This causes all the voltages applied to the control line CLn to be low level, and accordingly the level shifting functions of all the level shifters LSn are active.

Immediately after the clock signal CK1 has become low level, the clock signals CK2, CK3, . . . , CKN are also at low level. Accordingly, all the clock signals CKn become low level, and the level shifting functions of all the level shifters LSn are active during this time period.

Under the condition where all the output signals OUTn have the power voltage Vss of a low level, when the clock signal CK2 of a high level, which is lower than the driving voltage Vdd, is applied to the level shifter LS2 and when the clock signals CK1, CK3, . . . , CKN of a low level are applied to the level shifters LS1, LS3, . . . , LSN, respectively, the level shifter LS2 outputs the output signal OUT2 which was raised to the driving voltage Vdd.

When the output signal OUT2 is at high level, the active period presence detecting circuit S1 causes the active period detecting circuit EN2 to output the signal ENOUT2 of a low level. Accordingly, the voltage applied to the control line CL2 also becomes low level. As a result, the level shifting function of the level shifter LS2 is active while the output signal OUT2 is at high level.

Here, the respective signals ENOUT1, ENOUT3, . . . , ENOUTN of the active period detecting circuits EN1, EN3, . . . , ENN are at high level, and accordingly the level shifting functions of the levels shifters LS1, LS3, . . . , LNN are suspended. Accordingly, the output signals OUT1, OUT3, . . . , OUTN are at low level.

Immediately after the clock signal CK2 has become low level, the clock signals CK1, CK3, . . . , CKN are also at low level. Accordingly, all the clock signals CKn become low level, and the level shifting functions of all the level shifters LSn are active during this time period.

This procedure is repeated as shown in the timing chart of FIG. 6, so as to output the output signals OUTn, which are produced by raising the high levels of the clock signals CKn, whose high levels are lower than the driving voltage Vdd.

The hatched portion in the timing chart of FIG. 6 indicates the time period in which the level shifting of the level shifter LSn is suspended.

While one of the level shifters LSn outputs the output signal OUTn of a high level, the level shifting of all the other level shifters LSn is suspended.

It is therefore possible, in the non-active period in which no level shifting into a different level is carried out, to reduce the power dissipation due to the channel resistance or wire resistance of the MOS transistor caused by the feedthrough current in the offsetter section 2 and the level shift section 3, which accounts for much of power dissipation. As a result, the power dissipation of the level shifter circuit 21 can be significantly reduced.

Note that, the foregoing embodiment described the case where N kinds of clock signals CKn are out of phase with one another so that their high level periods do not overlap. However, the present invention is not just limited to this, and the technical idea of the present invention is also applicable to N kinds of clock signals whose low level periods do not overlap, or even N kinds of clock signals having non-overlapping low level periods and non-overlapping high level periods.

Generally, any type of level shifter may be used, provided that it is provided per clock signal and it carries out the level shifting of converting a high level of the clock signal to either a high level or low level of a predetermined power voltage, and converting a low level of the clock signal to the other level of the predetermined power voltage.

Further, in a specific time period in a non-active period of the clock signal CKn, which specific time period corresponds to the active period of the other clock signals CKn, the level shifter LSn of the level shifter circuit 21 may generate and output a non-active level (power voltage Vss) that is different from the level of the clock signal resulting from the level shifting, using an alternative voltage that is generated by pull-up or pull-down to the power voltage Vss, instead of using the voltage that is generated by flowing the constant current in the offsetter section 2 and the level shift section 3.

Here, the non-active level is described as the power voltage Vss. However, any level may be used so long as it does not operate the next stage circuit of the level shifter circuit 21. Further, even when the alternative voltage is generated by the active pull-up to the driving voltage Vdd, the same non-active level may be produced by increasing the number of inverter stages.

In the foregoing configuration, instead of the feedthrough current, a charge/discharge current with respect to the gate of the input-stage MOS transistor of the inverter I1 is flown, and accordingly the only current is the charge/discharge current at the gate of the MOS transistor due to switching of the MOS transistor. As a result, a voltage level for a non-active period can always be obtained at low power consumption.

Further, the foregoing used an active element such as the driving transistor N6 for the active pull-up or active pull-down. However, instead of the active element, a resistor having a large resistance may be used to carry out pull up to the driving voltage Vdd or pull down to the power voltage Vss. The same effect can be obtained in this case.

Further, in the level shifter circuit 21, the duty of the non-overlapping high level period of the clock signal CKn is less than (100×1/N) %, and as such the high level periods of the N kinds of clock signals CKn never overlap, enabling the active periods of the clock signals CKn to be freely selected, as required, to carry out level shifting.

The same effect can also be obtained when the N kinds of clock signals have non-overlapping low level periods whose duty is less than (100×1/N) %. Further, in the level shifter circuit 21, the level shifter LSn includes a step-up section of a switching MOS transistor structure, which is provided as a circuit that flows the feedthrough current in the offsetter section 2 and the level shift section 3. The step-up section is comprised of the transistor N4 as a MOS transistor whose source receives the clock signal CKn.

The step-up section is of a current driving type, by which the current is flown throughout the level shifting of the level shifters LSn, so as to raise the high levels of the clock signals CKn to the driving voltage Vdd, which is a high level of the power voltage.

The provision of the step-up section allows for level shifting of the clock signal CKn whose amplitude is smaller than the potential difference across the high level (driving voltage Vdd) and the low level (power voltage Vss) of the power voltage, only in the active period of the clock signal CKn, even when the threshold of the transistor N4 is greater than the amplitude of the clock signal CKn and the characteristics of the MOS transistor are relatively poor.

The effect of providing the step-up section can also be obtained by providing a step-down section, which lowers the low level of the clock signal to the low level of the power voltage, or by providing both the step-up section and the step-down section.

Further, in the level shifter circuit 21, the non-overlapping high level periods of the clock signals CKn are active periods of the clock signals CKn, and the time period in which the level shifter LSn suspends the level shifting of the clock signal CKn corresponds to the active period of the other clock signals CKn.

Thus, during this period, only the level shifter that has received the high level clock signal carries out level shifting. This enables the level shifting control means, which is realized by all the control transistors N5 and all the control lines CLn, to use the output signal OUTn, which results from the level shifting of the clock signal CKn in the active period, as a signal that suspends the level shifting of the other level shifters LSn.

Further, in the level shifter circuit 21, the active period of each clock signal CKn is the high level period. Among the level shifters LSn that receive the N kinds of clock signals CKn of non-overlapping high level periods (active periods), only the level shifter LSn that has received the clock signal CKn of a high level carries out the level shifting to the driving voltage Vdd, while the level shifting control means suspends level shifting of the other level shifters LSn.

In the manner described above, the active period detecting means detects an active period in the clock signal CKn supplied to the level shifter LSn, and the level shifting control means uses the result of level shifting of the clock signal CKn to the driving voltage Vdd as a signal for suspending the level shifting of the other level shifters LSn.

Considering the case where the active period of each clock signal CKn is the low level period, among the level shifters LSn that receive the N kinds of clock signals CKn of non-overlapping low level periods (active periods), only the level shifter LSn that has received the clock signal CKn of a low level carries out the level shifting to the power voltage Vss, while the level shifting control means suspends the level shifting of the other level shifters LSn.

In this case, the level shifting control means uses the result of level shifting of the clock signal CKn to the driving voltage Vss as a signal for suspending the level shifting of the other level shifters LSn.

Fourth Embodiment

Still another embodiment of the present invention is described below with reference to FIG. 7 and FIG. 8. Unless noted otherwise, members having analogous functions to those described in the foregoing First through Third Embodiments are given the same reference numerals and explanations thereof are omitted here.

Figure 7:
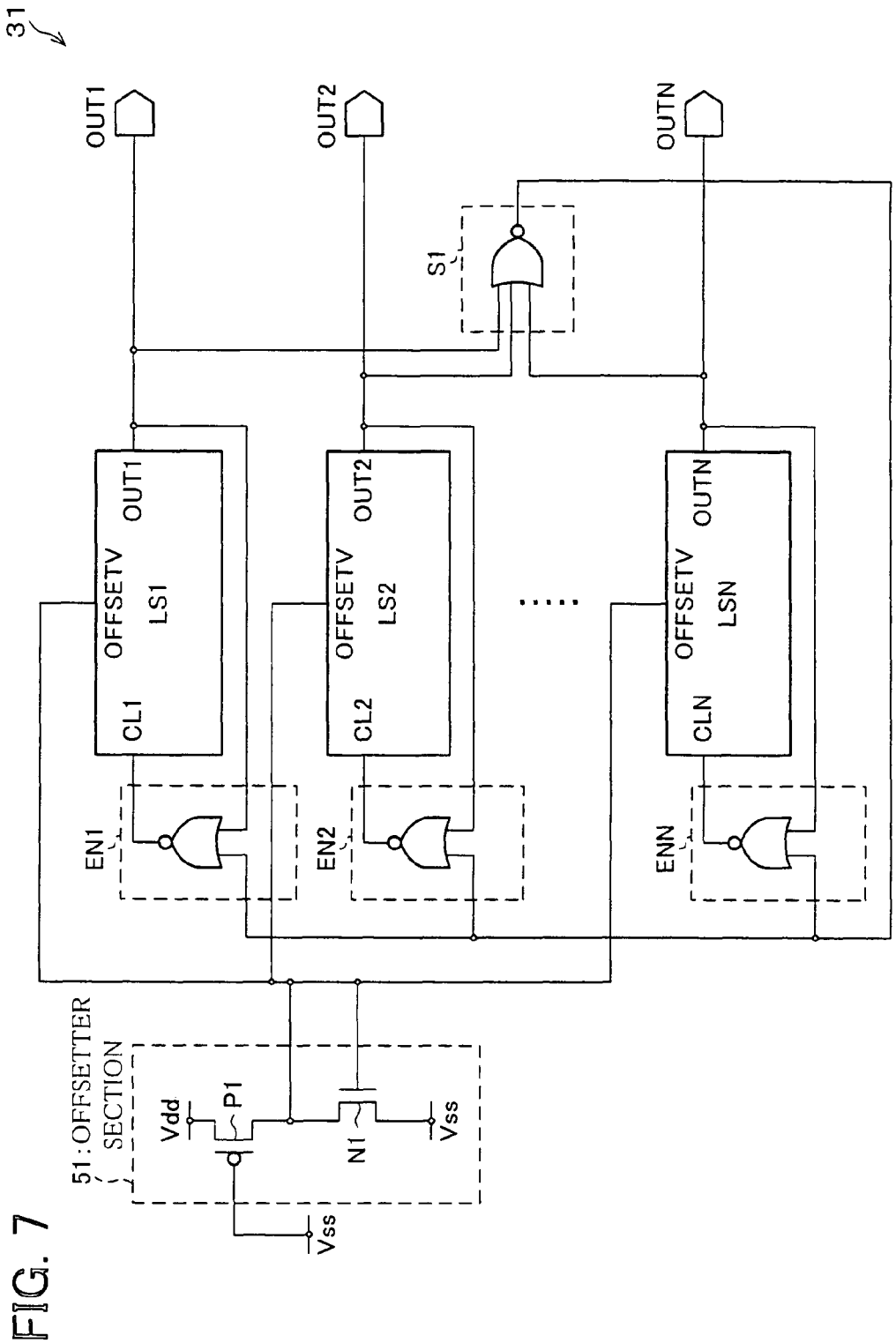
FIG. 7 is a block diagram showing a structure of a level shifter circuit of a Fourth Embodiment according to the present invention.

FIG. 7 shows a structure of a level shifter circuit 31 of the present embodiment. The level shifter circuit 31 is provided with a single offsetter section 51 as shown in FIG. 7, instead of the offsetter section 2 of FIG. 5 provided in each level shifter LSn in the level shifter circuit 21 shown in FIG. 4. In addition, the level shifter circuit 31 includes a pass circuit 12, as shown in FIG. 3, in each level shifter LSn, as shown in FIG. 8. The control lines CLn connect these and other circuit elements slightly differently from that described in the foregoing embodiments, as described below.

The offsetter section 51 is analogous to that shown in FIG. 2, except that it is commonly provided for all level shifters LSn. The control line CLn connects the output terminal of the active period detecting circuit ENOUTn to the respective gates of the control transistor N5, the driving transistor N6, the P-channel MOS transistor of the analog switch A1, and to the input terminal of the inverter I3 in the level shifter LSn.

Figure 8:
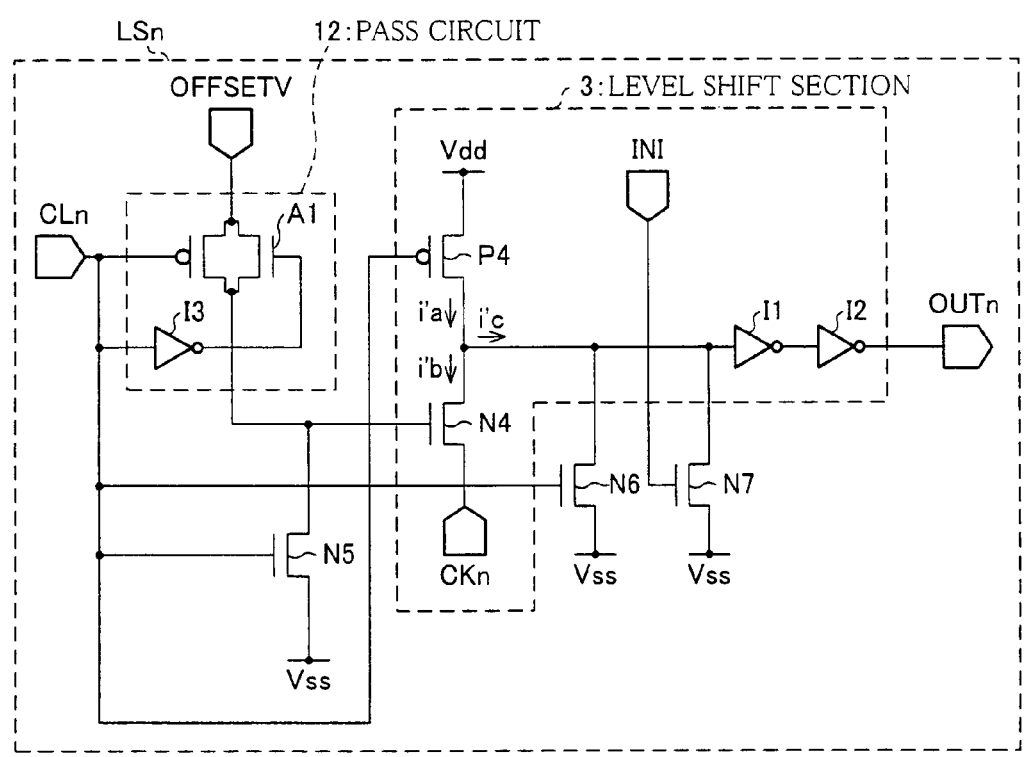
FIG. 8 is a circuit diagram showing one level shifter provided in the level shifter circuit section of FIG. 7, without the provision of an offsetter section.

In FIG. 8, the terminal connecting the analog switch A1 and the offsetter section 51 is shown to receive an offset voltage OFFSETV. Thus, under applied low level voltage to the control line CLn, the offsetter section 51 applies the offset voltage OFFSETV to the gate of the transistor N4.

Under applied high level voltage to the control line CLn, the supply of the offset voltage OFFSETV from the offsetter section 51 to the gate of the transistor N4 is prevented, so as to prevent transfer of the power voltage Vss, which is applied to the gate of the transistor N4 via the control transistor N5, to the offsetter section 51.

That is, in the present embodiment, the control transistors N5, the control lines CLn, and the pass circuits 12 as a whole make up the level shifting control means.

In the level shifter 31, the feedthrough current is prevented from flowing through the series circuit of the constant current source transistor P4 and the transistor N4 of the level shift section 3 during a specific time period in the non-active period of the clock signal CKn, the specific time period being the active period of the other clock signals CKn.

As a result, the power dissipation, which would have been caused by the feedthrough current, can be eliminated. Further, the feedthrough current that flows the common offsetter section 51 exists only for the level shifter carrying out the level shifting. To put it in reverse, the feedthrough current in the offsetter section 51 is eliminated with respect to the level shifter that is not carrying out the level shifting, thereby also reducing power consumption by this amount.

In the foregoing configuration, the offsetter section 51 which generates and outputs the offset voltage irrespective of whether the clock signal is in a specific time period or not is commonly provided for all the level shifters LSn. This simplifies the circuit structure and reduces power consumption.

Further, in the case where the level shifter circuit 31 has a peripheral circuit that uses the output voltage of the offsetter section 51, the voltage may be shared by such a peripheral circuit and the offsetter section 51. In this way, it is also possible to simplify the circuit structure and reduce power dissipation.

Fifth Embodiment

Figure 9:
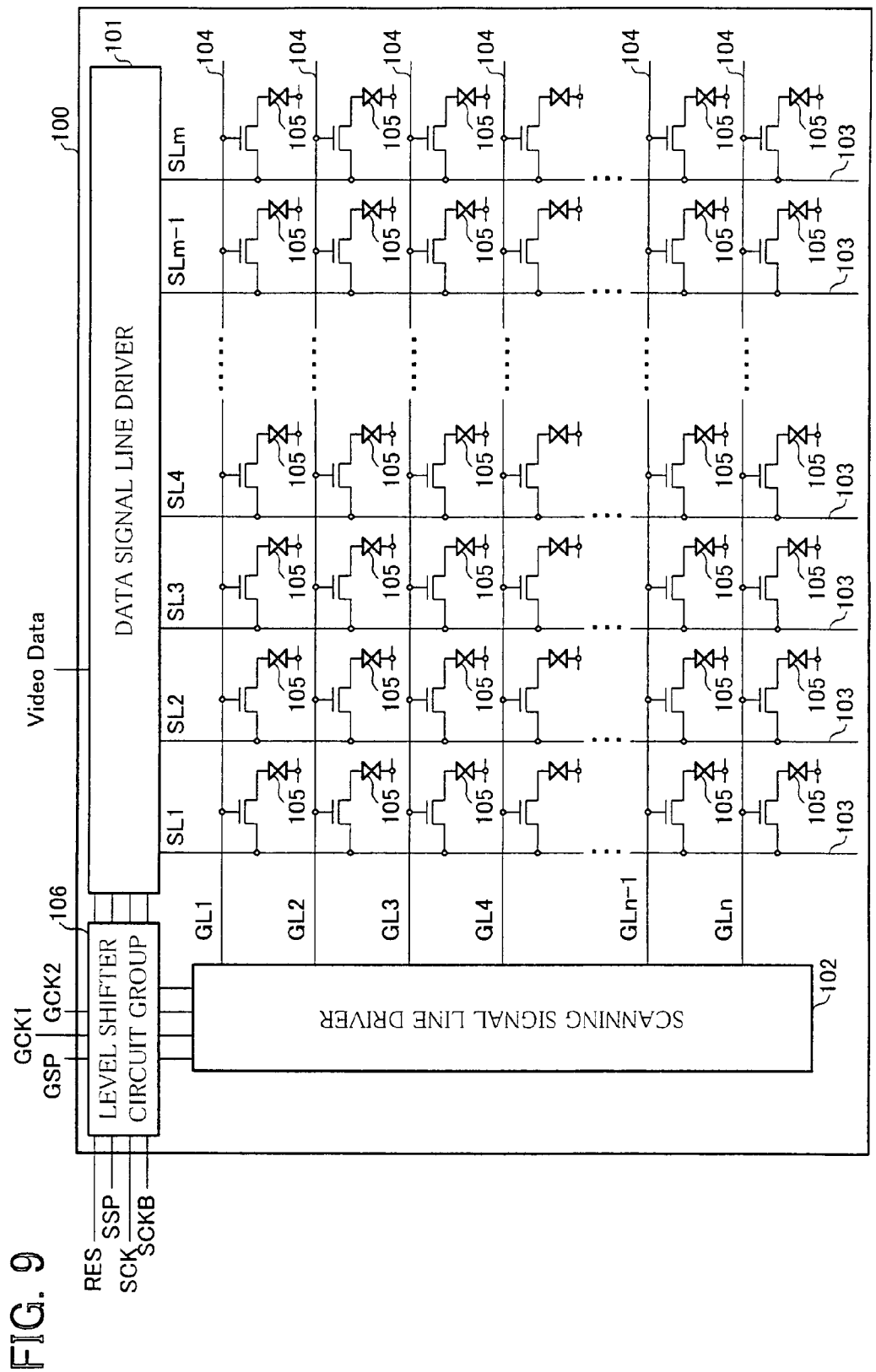
FIG. 9 is a block diagram showing a structure of a display device of a Fifth Embodiment according to the present invention.
Figure 10:
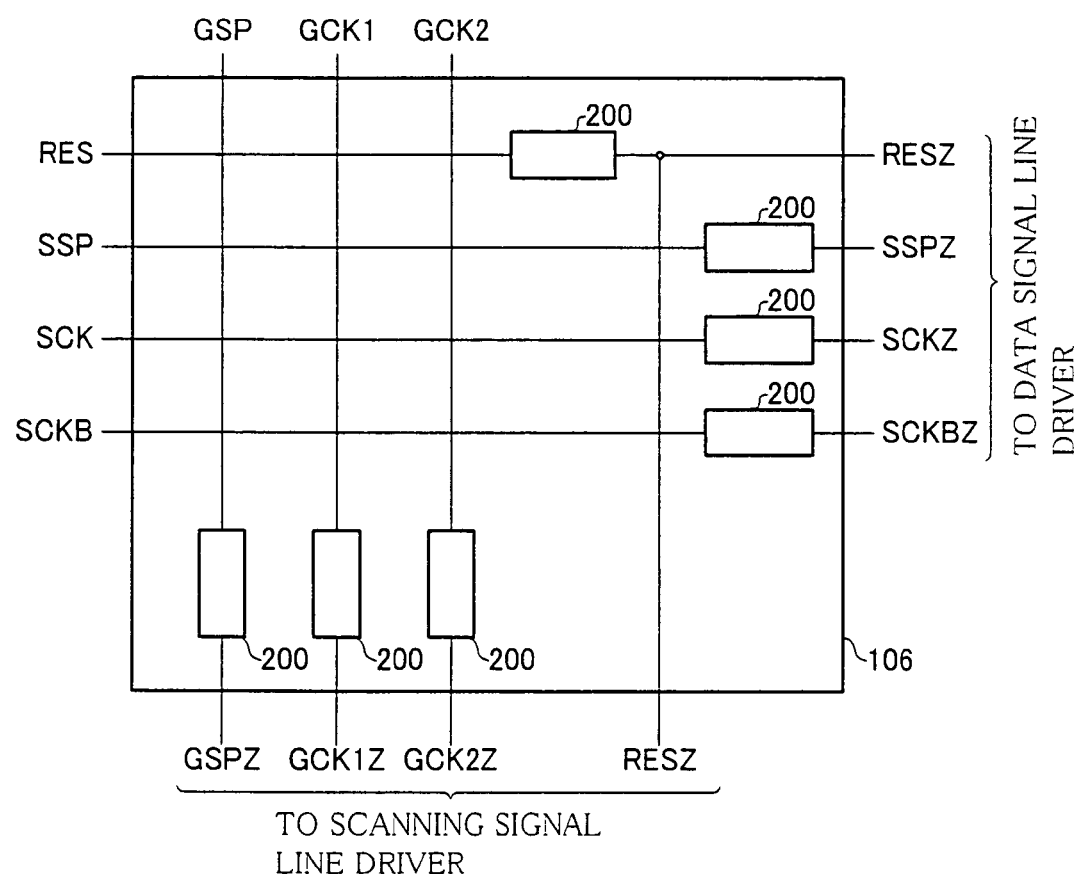
FIG. 10 is a block diagram showing a structure of a level shifter circuit group provided in the display device of FIG. 9.

Referring to FIG. 9 and FIG. 10, yet another embodiment of the present invention is described below. Unless otherwise noted, members having analogous functions to those described in the foregoing First through Fourth Embodiments are given the same reference numerals and explanations thereof are omitted here.

The present embodiment describes a display device that is provided with the level shifter circuit of any one of the foregoing First through Fourth Embodiments. FIG. 9 shows a schematic structure of a matrix type display device 100 as such a display device.

The matrix type display device 100 is, for example, a liquid crystal display device which includes a plurality of display elements (pixels) 105 that are disposed in a matrix, a plurality of data signal lines 103 (SL1 through SLm) that are disposed in parallel in a column direction, and a plurality of scanning signal lines 104 (GL1 through GLn) that are disposed in parallel in a row direction. The data signal lines 103 are connected to a data signal line driver 101, and the scanning signal lines 104 are connected to a scanning signal line driver 102.

The matrix type display device 100 receives various signals, including data operation clock signals SCK, SCKB for driving the data signal line driver 101, a data driving start signal SSP for starting driving, scanning operation clock signals GCK1, GCK2 for driving the scanning signal driver 102, a scanning driving starting signal GSP for starting driving, and an initializing signal RES for initializing the drivers. These signals are supplied to the data signal line driver 101 or the scanning signal line driver 102 after they are level shifted by a level shifter circuit group 106.

The scanning signal line driver 102 feeds a scanning signal to the scanning lines 104 in synchronism with the scanning clock signals (first clock signal) GCK1, GCK2. The data signal line driver 101 receives a video signal ("video data" in FIG. 9) which indicates a display state of the display element 105 and is supplied in synchronism with the data operation clock signals (second clock signal) SCK, SCKB, and the data signal line driver 101 extracts therefrom a data signal for the display element 105 of the scanning signal line 104 that has received the scanning signal, and supplies the data signal to the data signal line 103.

The data operation clock signals SCK, SCKB are out of phase with each other, so as to have at least one of non-overlapping high level periods and non-overlapping low level periods. Likewise, the scanning operation clock signals GCK1, GCK2 are out of phase with each other, so as to have at least one of non-overlapping high level periods and non-overlapping low level periods.

In order to level shift the two pairs of clock signals of different kinds to a voltage that can operate the shift registers, the level shifter circuit group 106 has the level shifter circuit of any one of the foregoing First through Fourth Embodiments for the each pair of clock signals.

The level shifter circuit group 106 is required because the signals SCK, SCKB, SSP, GCK1, GCK2, GSP, and RES supplied to the matrix type display device 100 are generated in an external IC of the matrix type display device 100 and therefore require the same operating voltage as the external IC.

A recent trend is that the operating voltage of the IC has been decreasing each year, and the data signal line driver 101 or the scanning signal line driver 102 in the matrix type display device 100 cannot operate on such a low voltage. The level shifter circuit group 106 is therefore required to level shift the voltage of the input signals to the operating voltage of the data signal line driver 101 or the scanning signal line driver 102.

FIG. 10 shows a structure of the level shifter circuit group 106. As shown in FIG. 10, a level shifter 200 is provided for each signal to be level shifted. Output signals that are produced by level shifting in the level shifters 200 are labeled with "Z" in their reference numerals. A pair of level shifters 200 of the data operating clock signals SCK, SCKB makes up the level shifter circuit of any one of the foregoing First through Fourth Embodiments. Likewise, a pair of level shifters 200 of the scanning operating clock signals GCK1, GCK2 makes up the level shifter circuit of any one of the foregoing First through Fourth Embodiments.

Note that, the level shifters 200 of the signals SCK, SCKB, SSP may be provided inside the data signal line driver 101. The level shifters 200 of the signals GCK1, GCK2, GSP may be provided inside the scanning signal line driver 102.

With the foregoing configuration, the power consumption of the level shifter circuit can be reduced, which in turn reduces the power consumption of the display device as a whole. Note that, the power consumption of the display device can be reduced as a whole when at least one of the first clock signal and the second clock signal is the two kinds of clock signals that are level shifted by the level shifter circuit of any of the foregoing First through Fourth Embodiments.

In the matrix-type display device 100, at least one of the scanning signal line driver 102 and the data signal line driver 101 (here, both), which receive the two kinds of clock signals that were level shifted by the level shifter circuit of any one of the foregoing First through Fourth Embodiments, are formed on the same substrate as the display section having a plurality of display elements 105, together with the level shifter circuit.

This enables the wiring for the clock signals to be formed on the same substrate as well. For example, the data signal line driver 101 and the scanning signal line driver 102 may be formed on an insulating substrate such as a glass substrate, together with the display section and the level shifter circuit (driver monolithic structure). For the insulating substrate, a sapphire substrate, a quartz substrates or a non-alkali glass substrate are often used.

In the present invention, by monolithically forming the data signal line driver 101 and/or the scanning signal line driver 102 on the same substrate as the display section together with the level shifter circuit, less trouble is caused and less wiring is required in manufacture.

Further, compared with the display device that uses an external IC as a driver, the present invention requires a fewer number of input terminals on the glass substrate. Thus, in manufacture, the cost of mounting components on the glass substrate can be reduced, and a fewer defects are caused by such mounting. As a result, it is possible to reduce the manufacturing cost or mounting cost of the drivers, in addition to improving reliability of the drivers.

The pixel transistors of the matrix-type display device 100 are thin film transistors, which are provided for the data signal line driver 101 and the scanning signal line driver 102. In order to integrate the display elements 105 more densely and to increase the display area, polycrystalline silicon is used for the thin film transistors.

The polycrystalline silicon thin film transistors are prepared by depositing a contamination-preventing silicon oxide film, for example, on a glass substrate, and by forming field effect transistors thereon.

The thin film transistors are structured such that a polycrystalline silicon thin film with a channel region, a source region, and a drain region are formed on the silicon oxide film, and a gate insulating film, gate electrodes, an interlayer insulating film, and metal leads are formed on the polycrystalline silicon thin film.

The polycrystalline silicon thin film transistor has a forward stagger (top gate) structure, in which the polycrystalline silicon thin film on the insulating substrate is the active layer. The polycrystalline silicon thin film transistor may alternatively have a reverse stagger structure. Further, the thin film transistors may be made of other materials, such as monocrystalline silicon or amorphous silicon.

With the use of the polycrystalline silicon thin film transistors, the data signal line driver 101 and the scanning signal line driver 102 with a practical driving ability can be fabricated on the same glass substrate, where the display section is formed, as the display elements 105 in substantially the same manufacturing step.

Sixth Embodiment

Figure 11:
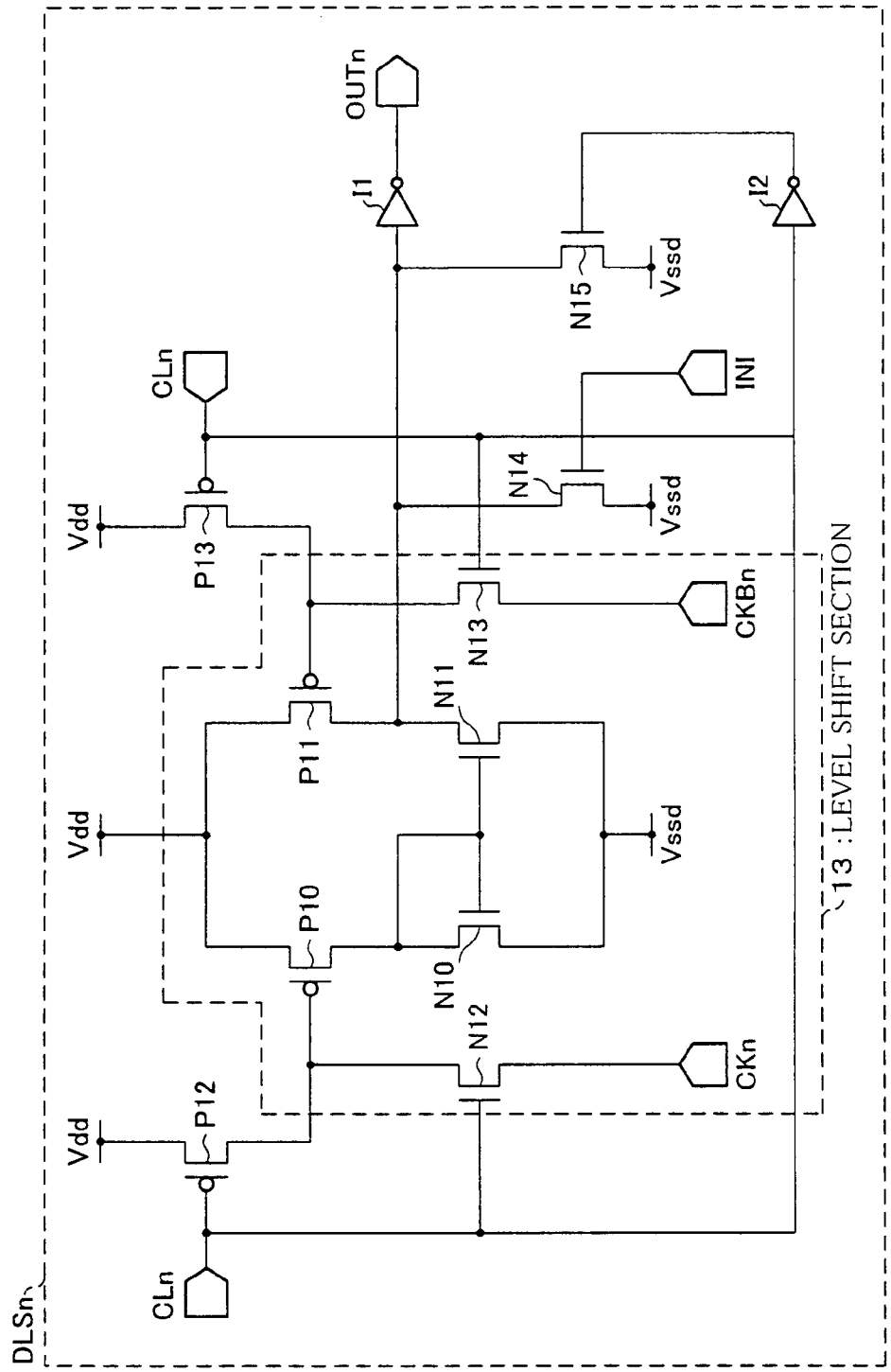
FIG. 11 is a circuit block diagram showing a level shifter circuit of a Sixth Embodiment according to the present invention.
Figure 12:
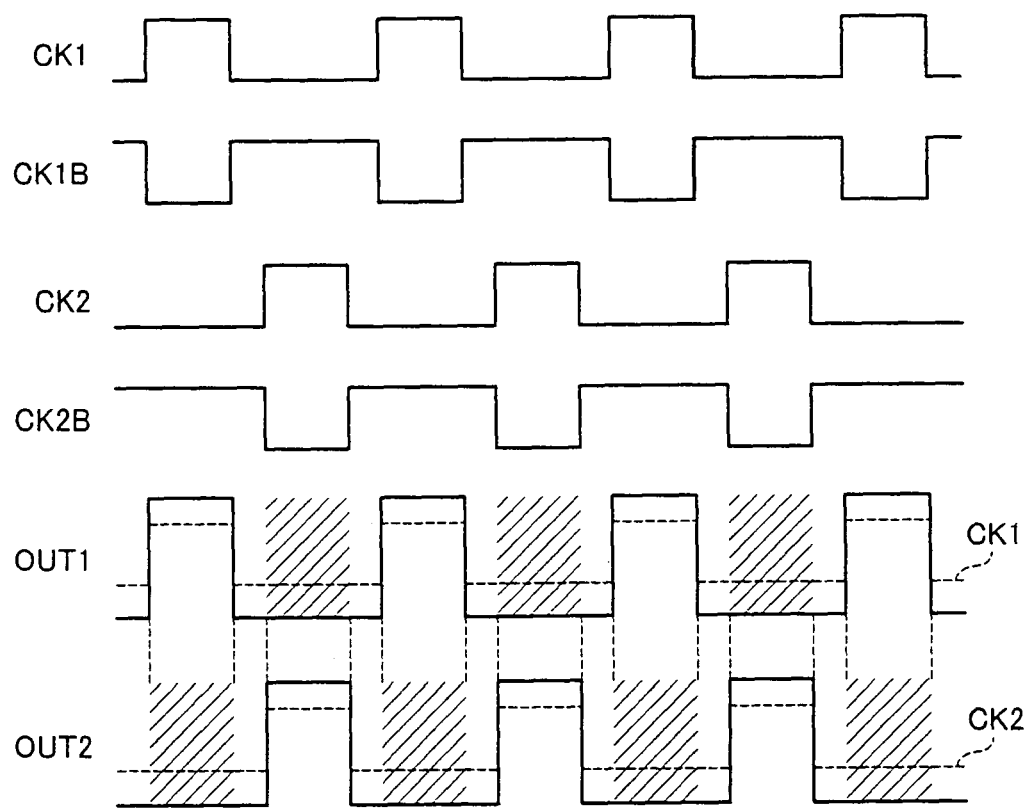
FIG. 12 is a timing chart showing clock signals supplied to the level shifter circuit of FIG. 11, and signals that are produced by level shifting of the clock signals.
Figure 13:
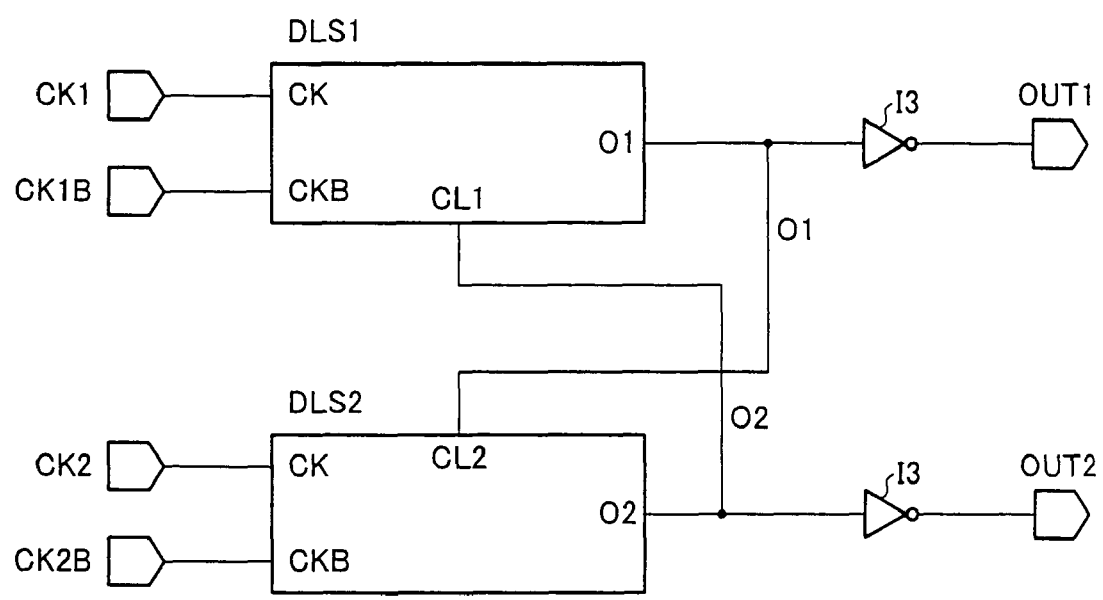
FIG. 13 is a block diagram showing an overall structure of the level shifter circuit.

Referring to FIG. 11 through FIG. 13, yet another embodiment of the present invention is described below.

FIG. 11 shows a structure of a level shifter circuit section DLSn of the present embodiment. The level shifter circuit section DLSn includes a level shift section 13 that is realized by constant current source transistors P10, P11, N-channel MOS transistors N10, N11, input signal terminals CK, CKB, and clock pass transistors N12, N13. The level shifter circuit section DLSn further includes control transistors P12, P13, a driving transistor N15, a control line CLn, inverters I1, I2, and an initializing transistor N14.

In order to operate the circuit of the next stage, the level shift section 13 changes the voltage level of the clock signal CK1, CK2 supplied to the input signal terminal CK, so that a high level of the clock signal CK1, CK2 is raised to a high level of a driving voltage Vdd (power voltage) and a low level of the clock signal CK1 or CK2 is decreased to a low level of a driving voltage Vssd (power voltage), wherein the high levels of the clock signals CK1, CK2 are lower than the high level of the driving voltage Vdd, and the low levels of the clock signals CK1, CK2 are higher than the low level of the driving voltage Vss, as shown in FIG. 12. The clock signal CK1, CK2 so raised or decreased is outputted as an output signal On.

The clock signals CK1, CK2 are out of phase with each other so that their high level periods do not overlap. Clock signals CK1B, CK2B are the inverted signals of the clock signals CK1, CK2, respectively. The high level periods of the clock signals CK1, CK2 are active periods in which the next stage circuit is operated, and the low level periods are non-active periods in which the next stage circuit is disabled.

FIG. 13 shows an overall structure of the level shifter circuit. The level shifter circuit is provided with level shifter sections DLS1, DLS2, an inverter I3, and output terminals OUT1, OUT2.

The level shifter sections DLS1, DLS2 each includes the level shift section 13 shown in FIG. 13, which is provided with the constant current source transistors P10, P11, and the N-channel MOS transistors ("transistors N10, N11," hereinafter), where the constant current source transistors P10, P11 are realized by P-channel MOS transistors. The source of the constant current source transistor P10 is connected to the power line of the driving voltage Vdd, and the drain of the constant current source transistor P10 is connected to the drain of the transistor N10 and to the gate of the transistor N11. The gate of the constant current source transistor P10 is connected to the drain of the control transistor P12 and to the drain of the clock pass transistor N12 that is realized by an N-channel MOS transistor.

The source of the transistor N10 is connected to the power line of the driving voltage Vssd, and the drain of the transistor N10 is connected to the drain of the constant current source transistor P10, to the gate of the transistor N10, and to the gate of the transistor N11. The gate of the transistor N10 is connected to the gate of the transistor N11 and to the drain of the constant current source transistor P10.

The source of the constant current source transistor P11 is connected to the power line of the driving voltage Vdd, and the drain of the constant current source transistor P11 is connected to the drain of the initializing transistor N14 that is realized by an N-channel MOS transistor, to the drain of the driving transistor N15, and to the input terminal of the inverter I1. The gate of the constant current source transistor P11 is connected to the drain of the control transistor P13 that is realized by a P-channel MOS transistor, and to the drain of the clock pass transistor N13 that is realized by an N-channel MOS transistor.

The source of the transistor N11 is connected to the power line of the driving voltage Vssd, and the drain of the transistor N11 is connected to the respective drains of the constant current source transistor P11, the initializing transistor N14, the driving transistor N15, and to the input terminal of the inverter I1. The gate of the transistor N11 is connected to the gate and drain of the transistor N10, and to the drain of the constant current source transistor P10.

The control line CLn is connected to the gates of the clock pass transistors N12, N13, to the gates of the control transistors P12, P13, and to the input terminal of the inverter I2.

The source of the clock pass transistor N12 is connected to the input signal terminal CK, and the drain of the clock pass transistor N12 is connected to the drain of the control transistor P12, and to the gate of the constant current source transistor P10. The gate of the clock pass transistor N12 is connected to the control line CLn.

The source of the clock pass transistor N13 is connected to the input signal terminal CKB. The drain of the clock pass transistor N13 is connected to the drain of the control transistor P13, and to the gate of the constant current source transistor P13. The gate of the clock pass transistor N13 is connected to the control line CLn.

The source of the control transistor P12 is connected to the power line of the driving voltage Vdd. The drain of the control transistor P12 is connected to the gate of the constant current source transistor P10, and to the drain of the clock pass transistor N12. The gate of the control transistor P12 is connected to the control line CLn.

The source of the control transistor P13 is connected to the power line of the driving voltage Vdd. The drain of the control transistor P13 is connected to the gate of the constant current source transistor P11, and to the drain of the clock pass transistor N13. The gate of the control transistor P13 is connected to the control line CLn.

The source of the driving transistor N15 that is realized by a P-channel MOS transistor is connected to the power line of the driving voltage Vssd. The drain of the driving transistor N15 is connected to the drain of the constant current source transistor P11, to the drain of the transistor N11, to the drain of the initializing transistor N14, and to the input terminal of the inverter I2. The gate of the driving transistor N15 is connected to the output of the inverter I2. The input terminal of the inverter I2 is connected to the gates of the control transistors P12, P13, and to the gates of the clock pass transistors N12, N13.

The source of the initializing transistor N14 is connected to the power line of the driving voltage Vssd. The drain of the initializing transistor N14 is connected to the drain of the transistor N11, to the drain of the constant current source transistor P1, to the drain of the driving transistor N15, and to the input terminal of the inverter I1. The gate of the initializing transistor N14 is connected to the input terminal of the initializing signal INI.

Referring to FIG. 13, the output O1 from the level shifter circuit section DLS1 is supplied to the control line CL2 of the level shifter circuit section DLS2, and the output O2 from the level shifter circuit section DLS2 is supplied to the control line CL1 of the level shifter circuit section DLS1. The output O1, O2 is fed to the input terminal of the inverter I3, so as to be outputted as an output OUT1, OUT2.

The input terminals CK, CKB of the level shifter circuit section DLS1 receive the input signals CK1, CK1B, respectively. The input terminals CK, CKB of the level shifter circuit section DLS2 receive the input signals CK2, CK2B, respectively.

Referring to FIG. 13, the high levels of the clock signals CK1, CK1B, CK2, CK2B are lower than the driving voltage Vdd, and their low levels are higher than the driving voltage Vssd. Accordingly, the high levels of the outputs OUT1, OUT2 after level shifting are higher than the high levels of the clock signals CK1, CK2, and the low levels of the outputs OUT1, OUT2 are lower than the low levels of the clock signals CK1, CK2.

The level shifter circuit section DLSn operates as follows. When the control line CLn is at high level, the control transistors P12, P13 are off. Here, the clock pass transistors N12, N13 conduct to transfer the input signal from the input signal terminals CK, CKB to the constant current source transistors P10, P11, respectively.

Here, the input signal from the input signal terminal CK is active to enable level shifting. When the clock signal to the input signal terminal CK is at high level, the clock signal to the input signal terminal CKB is at low level. Conversely, when the clock signal to the input signal terminal CK is at low level, the clock signal to the input signal terminal CKB is at high level.

When the clock signal to the input signal terminal CK is at high level, the current through the constant current source transistor P10 is reduced, and the ON resistance is increased. The ON resistance of the transistor N10 divides the voltage to cause a potential drop across the gate and drain of the transistor N10. The gate and drain of the transistor N10 is connected to the gate of the transistor N11, and accordingly the current flow into the transistor N11 is reduced.

When the clock signal to the input signal terminal CK is at high level, the clock signal to the input signal terminal CKB is at low level. Accordingly, the current flow into the constant current source transistor P11 increases. As a result, the charge that flows out of the constant current source transistor P11 accumulates at the gate of the MOS transistor making up the inverter I1 that is connected to the drains of the constant current source transistor P11 and the transistor N11. When the potential at the gate of the MOS transistor making up the inverter I1 exceeds the inverting voltage of the inverter I1, the output of the inverter I1 becomes the driving voltage Vss. That is, when the clock signal to the input signal terminal CK is at high level, the output On becomes low level.

When the clock signal to the input signal terminal CK is at low level, the current flow into the constant current source transistor P10 increases and the ON resistance decreases. The ON resistance of the transistor N10 divides the voltage to cause a potential increase across the gate and drain of the transistor N10. The gate and drain of the transistor N10 are connected to the gate of the transistor N11, and accordingly the current flow into the transistor N11 increases.

When the clock signal to the input signal terminal CK is at low level, the clock signal into the input signal terminal CKB is at high level. Accordingly, the current flow into the constant current source transistor P11 decreases. As a result, the charge is released into the transistor N11 from the gate of the MOS transistor making up the inverter I1 that is connected to the drains of the constant current source transistor P11 and the transistor N11. When the potential at the gate of the MOS transistor making up the inverter I1 falls below the inverting voltage of the inverter I1, the output of the inverter I1 becomes the driving voltage Vdd. That is, when the clock signal into the input signal terminal CK is at low level, the output On is at high level.

When the control line CLn is at low level, the clock pass transistors N12, N13 are off, and the input signals from the input signal terminals CK, CKB are not transferred to the constant current source transistors P10, P11. Here, the control transistors P12, P13 conduct to apply a potential of the driving voltage Vdd to the gates of the constant current source transistors P10, P11. As a result, the constant current source transistors P10, P11 are turned off.

Accordingly, there is no current flow into the transistor N10 from the constant current source transistor P10 or into the transistor N11 from the constant current source transistor P11. The level shifting function of the level shifter circuit section DLSn is off in this case. The control line CLn is at low level, and accordingly the output of the inverter I2 is at high level to turn on the driving transistor N15. As a result, the output of the inverter I1 becomes high level, and the driving voltage Vdd is outputted as the output On.

Referring to the overall structure of the level shifter circuit shown in FIG. 11 and FIG. 13, and to the clock signals shown in FIG. 12, the following describes a state change before and after the input of the clock signals CK1, CK1B, CK2, CK2B.

The description will be given through the case where the two kinds of clock signals CK1, CK2, having non-overlapping high level periods below the driving voltage Vdd and higher than the driving voltage Vssd, shown in the timing chart of FIG. 12, are applied after the level shifter circuit sections DLS1, DLS2 have attained a stable state from an unstable initial state. The duty of the high level periods of the clock signals CK1, CK2 is below (100×0.5) %. The clock signals CK1B, CK2B are the inverted signals of the clock signals CK1, CK2, respectively.

First, in order to stabilize the level shifter circuit sections DLS1, DLS2, an initializing signal INI of the driving voltage Vdd is applied to the gate of the initializing transistor N14 in an instable initial state of the level shifters DLS1, DLS2. This turns on the initializing transistor N14.

As a result, the input voltage of the inverter I1 becomes the power voltage Vssd. If the voltage is below the theoretical inverting voltage of the inverter I1, the outputs O1, O2 become the driving voltage Vdd. Because the potential of the driving voltage Vdd is applied to the input terminal of the inverter I3, the output voltage of the inverter I3 becomes the driving voltage Vssd. As a result, the output signals OUT1, OUT2 become the driving voltage Vssd as the low level.

Here, the outputs O1, O2 of the level shifter circuit sections DLS1, DLS2 are both at high level, and accordingly the control lines CL1, CL2 are also high level, thereby enabling the level shifting function of the level shifter circuit sections DLS1, DLS2.

Once a stable state is attained from the initial state, the initializing signal INI assumes the potential (low level) of the driving signal to turn off the initializing transistor N14.

The output O1 becomes low level when the clock signal CK of a high level is supplied to the input signal terminal CK of the level shifter circuit section DLS1 under the condition where the level shifting function of the level shifter circuit sections DLS1, DLS2 is enabled immediately after the initialization. Thus, by the level shifting, the output OUT1 becomes high level.

The output signal O1 is low level, and accordingly the control line CL2 is also at low level. In response, the level shifter circuit section DLS2 becomes non-active, the output O2 becomes high level, and the output OUT2 becomes low level by level shifting. The output O2 is high, and accordingly the control line CL1 is at high level to maintain the active state of the level shifter circuit section DLS1.

When the input signal CK1 changes from high level to low level, the output O1 becomes high level, and the output OUT1 becomes low level by level shifting. The output O1 is high level, and accordingly the control line CL2 is also at high level to activate the level shifter circuit section DSL2. The input signal CK2 is at low level immediately after the input signal CK1 has become low level, and accordingly the output O2 and the control line CL1 are high level. As a result, the level shifter circuit section DLS1 becomes active. The output OUT2 becomes low level by level shifting. When the clock signals CK1, CK2 are both low level, the level shifter circuit sections DLS1, DLS2 are active, and the level shifting function is enabled.

When the input signal CK2 becomes high level under this condition, high level is applied to the input signal terminal CK of the level shifter circuit section DLS2. This brings the output O2 to low level, and accordingly the output OUT2 becomes high level by level shifting.

Since the control line CL1 is at low level, the level shifter circuit section DLS1 becomes non-active and the output O1 becomes high level. As a result, the output OUT1 becomes low level by level shifting. The output O2 is high, and accordingly the control line CL2 is at high level to maintain the active state of the level shifter circuit section DLS2.

When the input signal CK2 changes from high level to low level, the output O2 becomes high level, and the output OUT2 becomes low level by level shifting. The output O2 is high level, and accordingly the control line CL1 is also at high level to activate the level shifter circuit section DSL1.

The input signal CK1 is at low level immediately after the input signal CK2 has become low level, and accordingly the output O1 and the control line CL2 are high level. As a result, the level shifter circuit section DLS2 becomes active. The output OUT1 becomes low level by level shifting.

This procedure is repeated as shown in the timing chart of FIG. 12, so as to output the output signals OUT1, OUT2, which are produced by raising the high levels of the clock signals CK1, CK2, whose high levels are lower than the driving voltage Vdd, and by simultaneously lowering the low levels of the clock signals CK1, CK2, whose low levels are higher than the power voltage Vss, to the power voltage Vss.

The hatched portion in the timing chart of FIG. 12 indicates the time period in which the level shifting of the level shifter circuit section DLS1, DLS2 is suspended. While one of the level shifter circuit sections DLS1, DLS2 outputs the signal of a high level, the level shifting of the other level shifter circuit section DLS1, DLS2 is suspended.

It is therefore possible, in the non-active period in which no level shifting into a different level is carried out, to reduce the power dissipation due to the channel resistance or wire resistance of the MOS transistor caused by the feedthrough current that flows into the transistor N11 from the constant current source transistor P10 and by the feedthrough current that flows into the transistor N11 from the constant current source transistor N11, which accounts for much of power dissipation. As a result, the power dissipation of the level shifter circuit 31 shown in FIG. 13 can be significantly reduced.

Note that, the foregoing embodiment described the case using two kinds of clock signals CK1, CK2 that are out of phase with each other so that their high level periods do not overlap, and using their respective inverted signals CK1B, CK2B. However, the present invention is not just limited to this, and the technical idea of the present invention is also applicable to two kinds of clock signals whose low level periods do not overlap, or even two kinds of clock signals having non-overlapping low level periods and non-overlapping high level periods, and their inverted signals.

Further, the present embodiment described the case where the level shifter circuit sections DLS1, DLS2 level shift and output the clock signals CK1, CK2 after they are inverted. However, the level shifter circuit sections DLS1, DLS2 may level shift and output the clock signals CK1, CK2 without inversion. It should be appreciated that the technical idea of the present invention is also applicable to this case because the high level or low level of the clock signal is level shifted to the high level or low level of the power voltage also in this case.

Thus, generally, any type of level shifter may be used, provided that it is provided per clock signal and it carries out the level shifting of converting a high level of the clock signal to either a high level or low level of a predetermined power voltage, and converting a low level of the clock signal to the other level of the predetermined power voltage. This is true for all of the embodiments described below.

Further, in a specific time period in a non-active period of the clock signal CK1, CK2, which specific time period corresponds to the active period of the other clock signal CK2, CK1, the level shifter circuit section DLS1, DLS2 of the level shifter circuit shown in FIG. 13 generates and outputs a non-active level (power voltage Vss) that is different from the level of the clock signal CK1, CK2 (power voltage Vssd) resulting from the level shifting, using an alternative voltage that is generated by pull-up or pull-down to the power voltage Vss, instead of using the voltage that is generated by flowing the constant current in the level shift section 13.

Here, the non-active level is described as the power voltage Vssd. However, any level may be used so long as it does not operate the next stage circuit of the level shifter circuit 1. Further, even when the alternative voltage is generated by the active pull-up to the driving voltage Vdd, the same non-active level may be produced by increasing the number of inverter stages.

In the foregoing configuration, instead of the feedthrough current, a charge/discharge current with respect to the gate of the input-stage MOS transistor of the inverter I1 is flown through the driving transistor N15, and accordingly the only current is the charge/discharge current at the gate of the MOS transistor due to switching of the MOS transistor. As a result, a voltage level for a non-active period can always be obtained at low power consumption.

Further, in the level shifter circuit shown in FIG. 13, the duty of the non-overlapping high level periods of the clock signals CK1, CK2 is less than (100×0.5) %, and as such the high level periods of the two kinds of clock signals CK1, CK2 never overlap, enabling the active periods of the clock signals CK1, CK2 to be freely selected, as required, to carry out level shifting. The same effect can also be obtained when the two kinds of clock signals have non-overlapping low level periods whose duty is less than (100×0.5) %.

Further, in the level shifter circuit shown in FIG. 13, the non-overlapping high level periods of the clock signals CK1 and CK2 are active periods of the clock signals CK1 and CK2, and the time period in which the level shifter circuit section DLS1, DLS2 suspends the level shifting of one of the clock signals CK1, CK2 is the active period of the other clock signal CK2, CK1.

Thus, during this period, only the level shifter that has received the high level clock signal carries out level shifting. This enables the level shifting control means, which is realized by the control transistors P12, P13 and the control lines CL1, CL2, to use the output signal O1, O2, which results from the level shifting of the clock signal CK1, CK2 in the active period, as a signal that suspends the level shifting of the other level shifter.

Further, an additional inverter may be provided on the output stage of the inverter I1 in the level shifter circuit section DLSn. In this case, multiple stages of level shifter circuit sections may be provided using the output of the additional inverter as OUTN, as with the level shifters LSn shown in FIG. 4 and FIG. 5. It should be noted here that the output OUTN, which is the inverted signal of the input signal CKN, can have the same phase as the input signal CKN by providing an inverter.

Further, the level shifter circuit section shown in FIG. 11 uses the input signal CK1 and its inverted signal CK1B, or the input signal CK2 and its inverted signal CK2B. The input signal from the input terminal CK, however, may be held at a constant voltage, so as to apply the offset voltage to the gate of the transistor N11. In this case, the constant current source transistor P10 and the transistor N10 may be used to realize the offsetter section used in the previous embodiments. Thus, the same technical idea of using a common offsetter section as described in reference to FIG. 3 and FIG. 7 may also be employed in this case.

Seventh Embodiment

Figure 14:
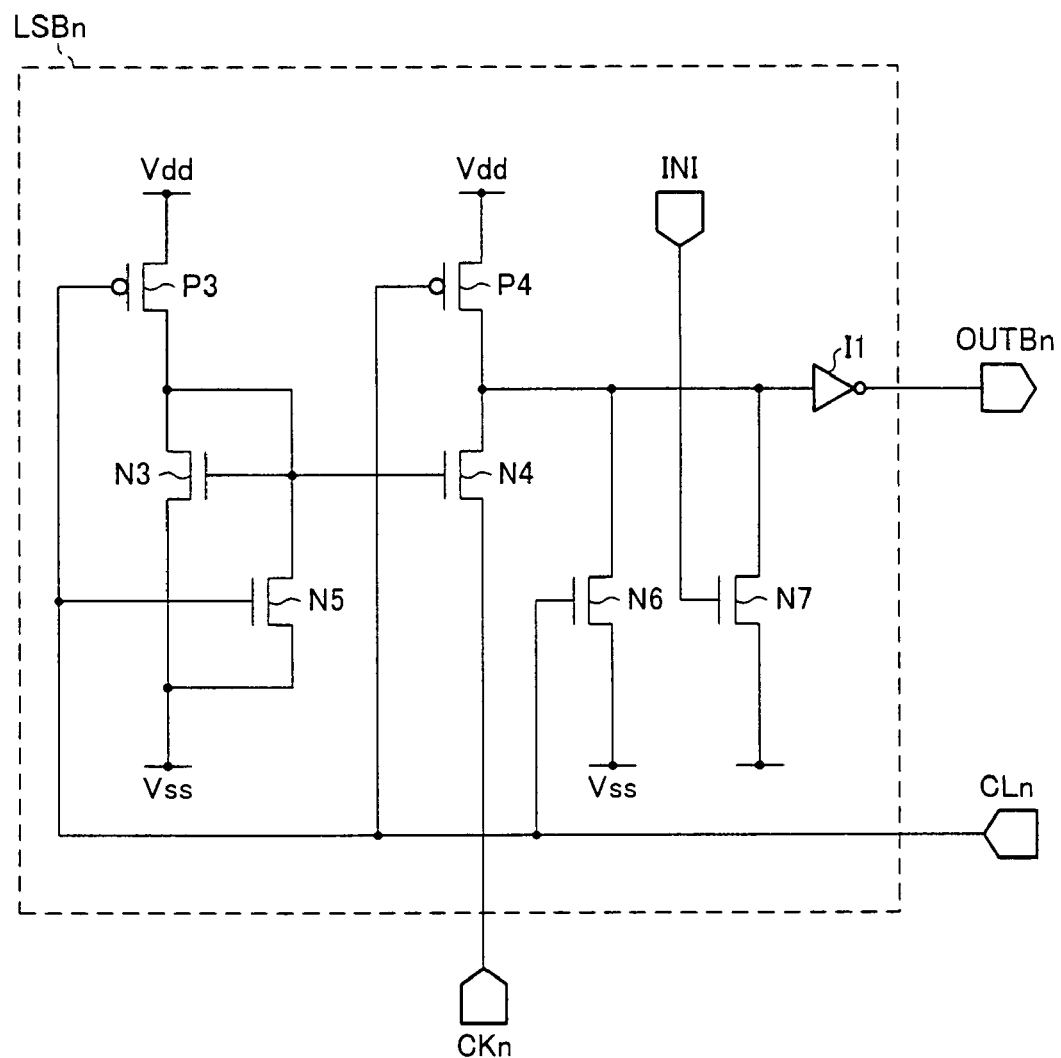
FIG. 14 is a circuit block diagram showing a structure of a level shifter circuit of a Seventh Embodiment according to the present invention.
Figure 15:
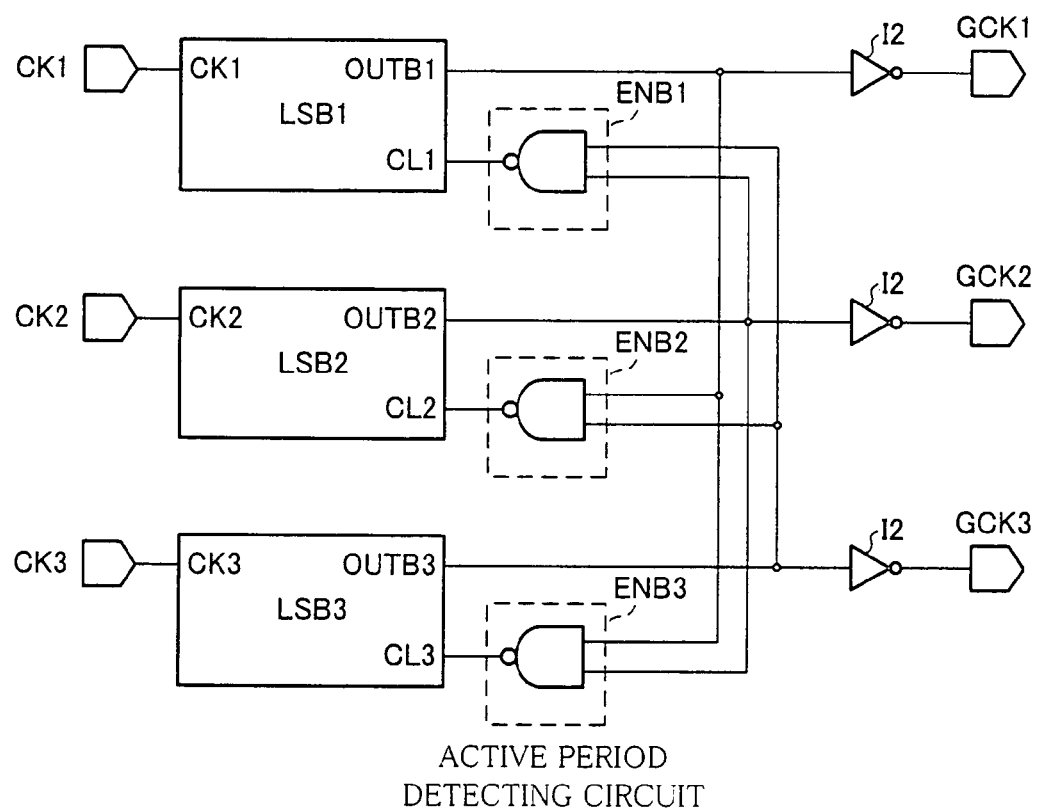
FIG. 15 is a block diagram showing an overall structure of the level shifter circuit.

FIG. 14 and FIG. 15 show another level shifter circuit of the present invention, in which three kinds of input clock signals are used. Even though the present embodiment is given through the case where three kinds of input clock signals are used, the principles described in the present embodiment are readily applicable to input clock signals of four or more kinds. Unless noted otherwise, members having the same reference numerals or signs are assumed to have analogous functions.

A level shifter circuit section LSBn shown in FIG. 14 have the same structure as the level shifter circuit section LSn of FIG. 5 and operates in the same manner except that the level shifter output of the inverter I1 is output OUTBn.

As shown in FIG. 15, the outputs OUTB1, OUTB2, OUTB3 of the level shifter circuit sections LSB1, LSB2, LSB3 are respectively supplied to the inverters I2. The inverters I2 output the received signals as GCK1, GCK2, and GCK3, respectively.

The control lines CL1, CL2, CL3 of the level shifter circuit sections LSB1, LSB2, LSB3 respectively receive the outputs of the active period detecting circuits which are realized by NAND circuits. Each active period detecting circuit receives the outputs of all the level shifter circuit sections except for that of the level shifter circuit section receiving the output of the corresponding active period detecting circuit.

Figure 16:
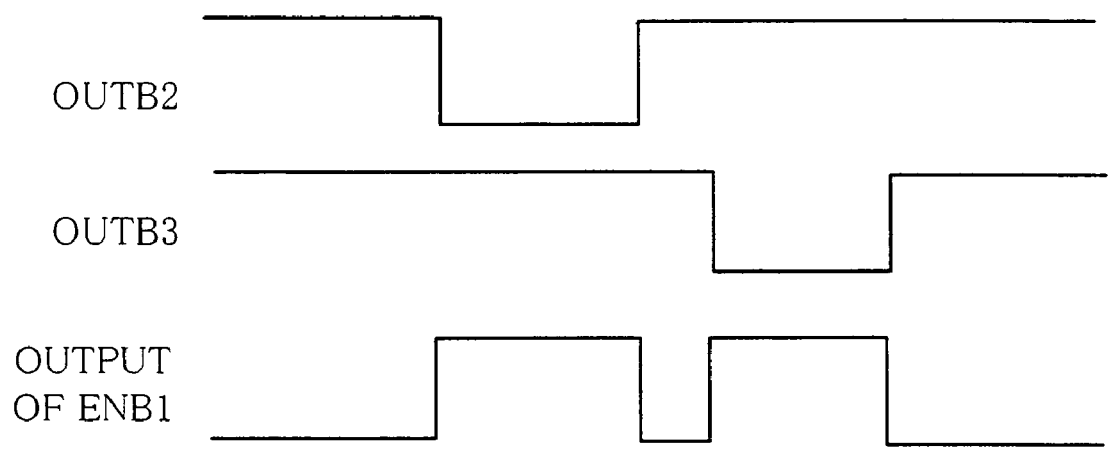
FIG. 16 is a timing chart of output signals from the level shifter circuit of FIG. 15, explaining how active periods are detected.

For example, the output of the active period detecting circuit ENB1 is supplied to the control line CL1 of the level shifter circuit section LSB1. Accordingly, the active period detecting circuit ENB1 receives the outputs OUTB2, OUTB3 of the level shifter circuit sections, but not that of the level shifter circuit section LSB1. FIG. 16 shows how the signals behave in this case. The outputs OUTB2, OUTB3 supplied to the active period detecting circuit ENB1 have low active periods. The output of the active period detecting section ENB1 is as shown in FIG. 16.

Figure 17:
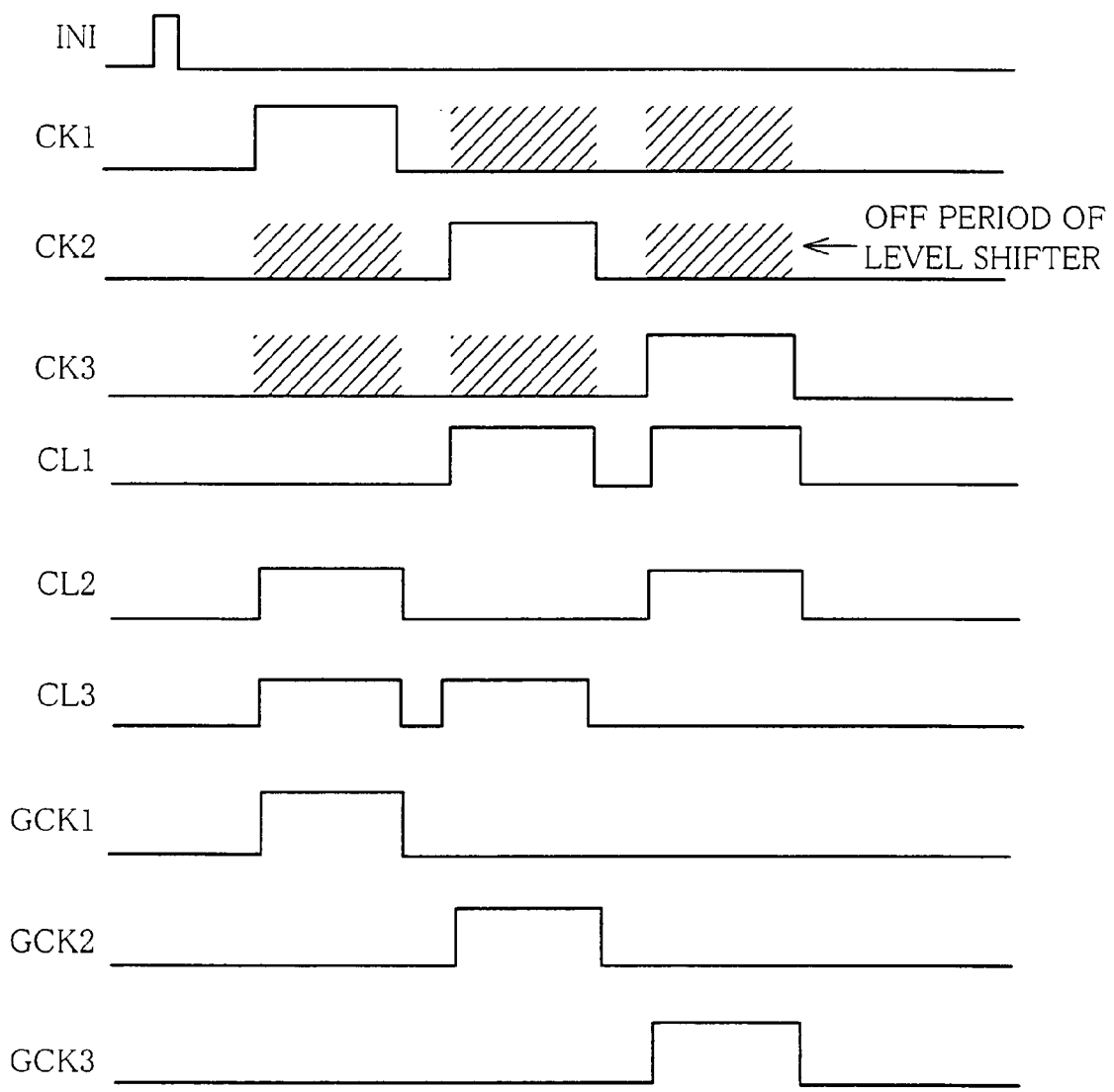
FIG. 17 is a timing chart showing clock signals supplied to the level shifter circuit of FIG. 15, and signals that are produced by level shifting of the clock signals.

FIG. 17 shows a timing chart of the input clock signals. The initializing signal INI is supplied immediately after the power is on. In response, the outputs OUTB1, OUTB2, and OUTB3 of the level shifter circuit sections all become high level. Because the outputs of the level shifter circuit sections are all at high level, the active period detecting circuits all output low level.

Accordingly, the level shifting function of all the active period detecting circuits is enabled. The input clock signal CK1 is supplied under this condition, as shown in FIG. 17. The input clock signal CK1 is level shifted in the level shifter circuit section LSB1 and outputted from OUTB1.

The output OUTB1 is supplied to the active period detecting circuits ENB2, ENB3, and the active period detecting circuits ENB2, ENB3 output level shift suspending signals of a high level, so as to suspend the level shifting of the level shifter circuit sections LSB2, LSB3. Here, the output OUTB2, OUTB3 of the level shifter circuit sections LSB2, LSB3 are at high level.

When the input clock signal CK1 changes from high level to low level, the output signal OUTB1 from the level shifter circuit section LSB1 becomes high level, and accordingly the outputs of all the level shifter circuits become high level, thereby enabling level shifting of all the level shifter circuit sections again.

Subsequently, the clock signals CK2, CK3 are successively supplied. In the described manner, the level shifting of the level shifter circuit sections other than the one receiving the clock signal is suspended, so as to level shift the input clock signals.

The hatched portions in the clock signals CK1, CK2, CK3 shown in FIG. 17 are the time periods in which the level shifting of the level shifter circuit sections receiving their respective signals is suspended. The operation of the level shifter circuit section is suspended during the time period indicated by the hatched portion, and accordingly there is no steady current flow during this period. As a result, power consumption can be greatly reduced.

Eighth Embodiment

Unless noted otherwise, members having the same reference numerals or signs are assumed to have analogous functions to those described in the foregoing embodiments.

FIG. 18 shows an image display device using a SSD (Source Shared Driving) circuit. The SSD circuit is used in an SSD section of FIG. 18, and it is used to channel a plurality of video line signals into source bus lines using switches during a horizontal period of image display, where the source bus lines are greater in number than the video signal lines. The SSD circuit is described below with reference to FIG. 19 and FIG. 20.

Figure 19:
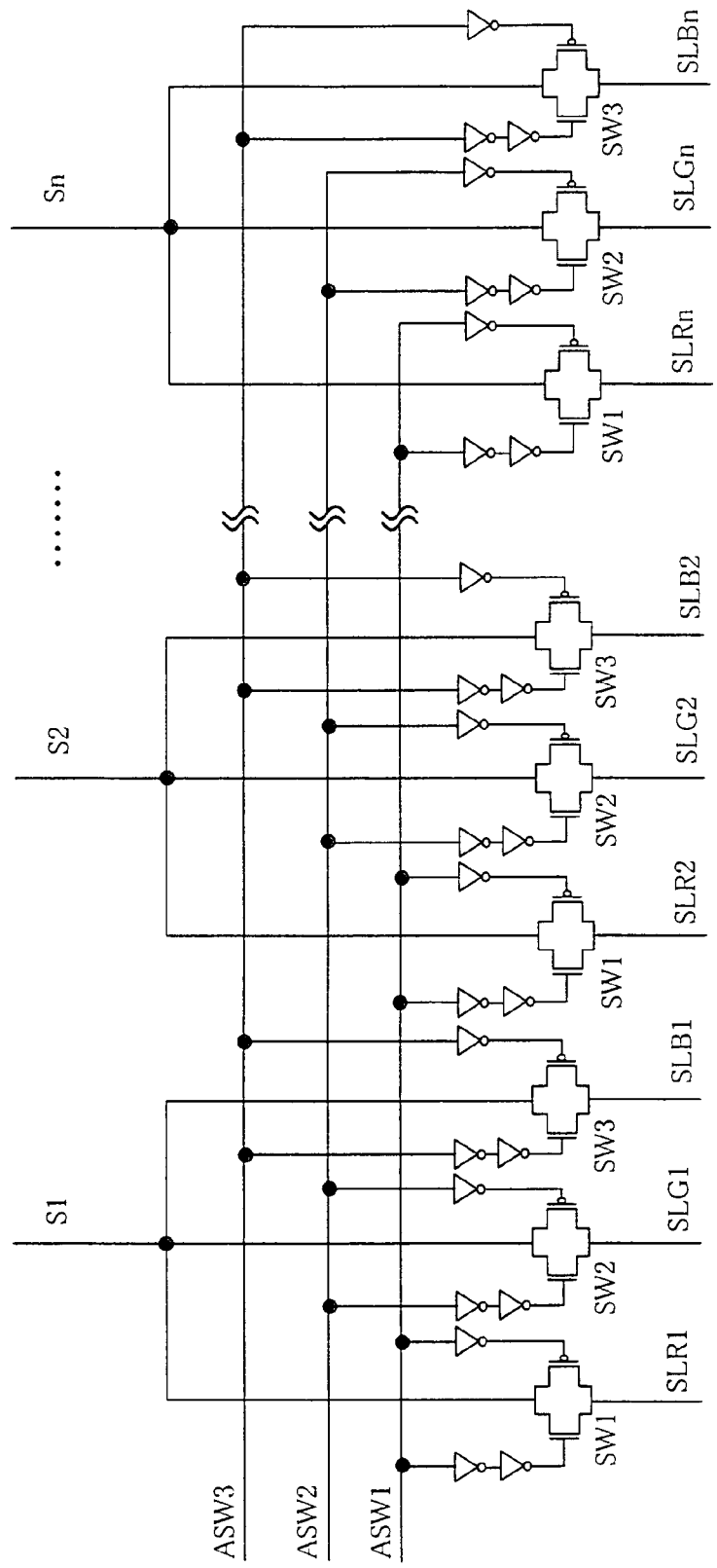
FIG. 19 is a circuit block diagram showing an SSD circuit of the display device.

FIG. 19 shows the SSD circuit of the SSD section. Input signals ASW1, ASW2, ASW3 control switching elements SW1, SW2, SW3, respectively. The switching elements SW1, SW2, SW3 are provided in groups, and a single video signal is supplied to each group of switching elements SW1, SW2, SW3. The video signal is supplied to all the switching elements SW1, SW2, SW3 of each group, and supplied eventually to three source bus lines via these switching elements. In the example of FIG. 19, n video signal lines S1 through Sn are provided, and accordingly the number of source bus lines is 3n.

The input signals ASW1, ASW2, ASW3 open switching elements SW1, SW2, SW3, so that the video lines S1 through Sn send the video signals to their respective source bus lines SLR1 through SLRn, SLG1 through SLGn, and SLB1 through SLBn.

The operation of the SSD circuit is described below in more detail with reference to the timing chart of FIG. 20. It is assumed here that the input signals ASW1, ASW2, ASW3 have high level active periods, i.e., the input signals ASW1, ASW2, ASW3 of a high level open the switching elements.

Figure 20:
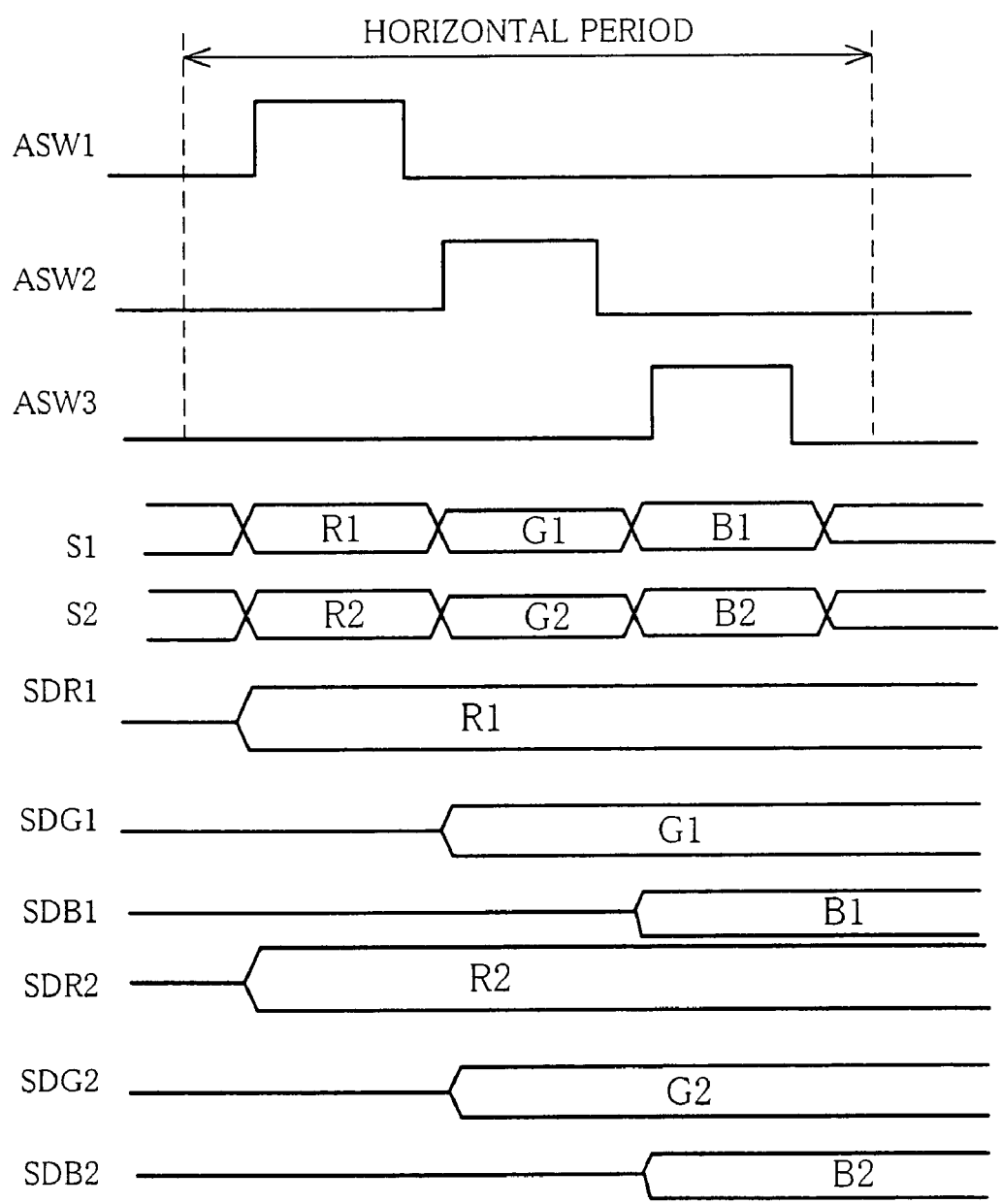
FIG. 20 is a timing chart showing operations of the SSD circuit.
Figure 21:
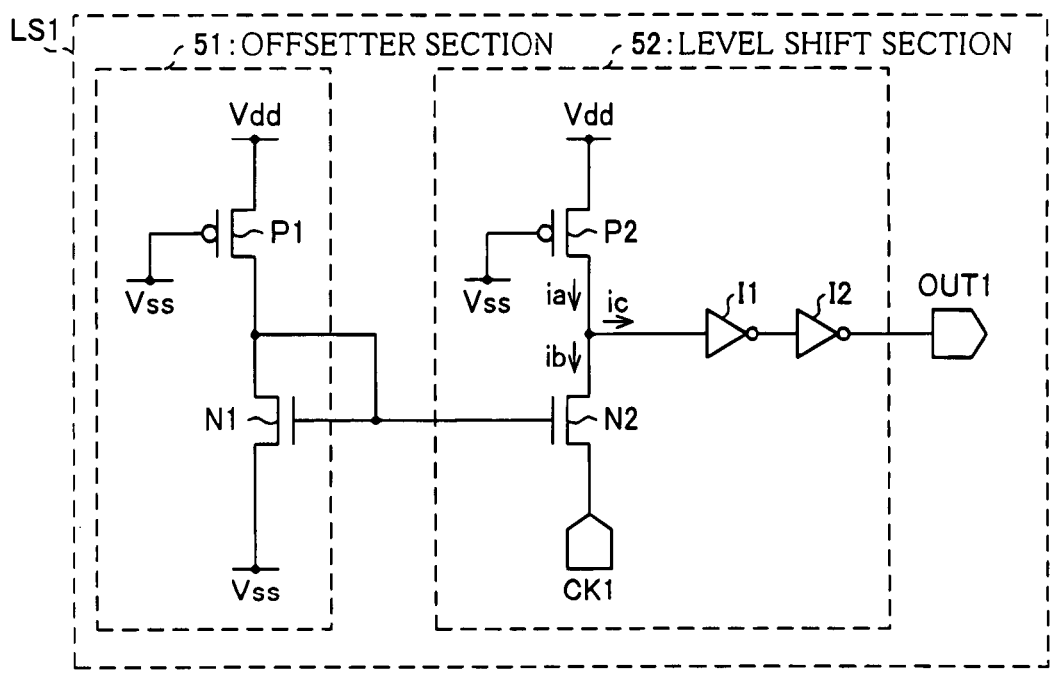
FIG. 21 is a circuit diagram showing a structure of a conventional level shifter circuit.
Figure 21:
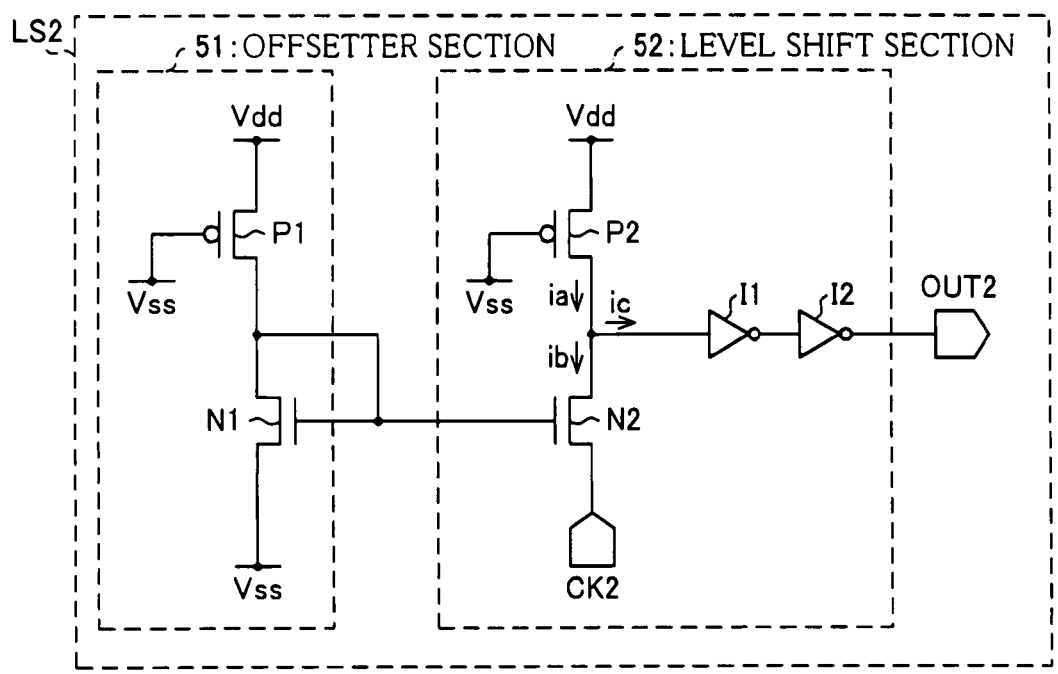
Figure 22:
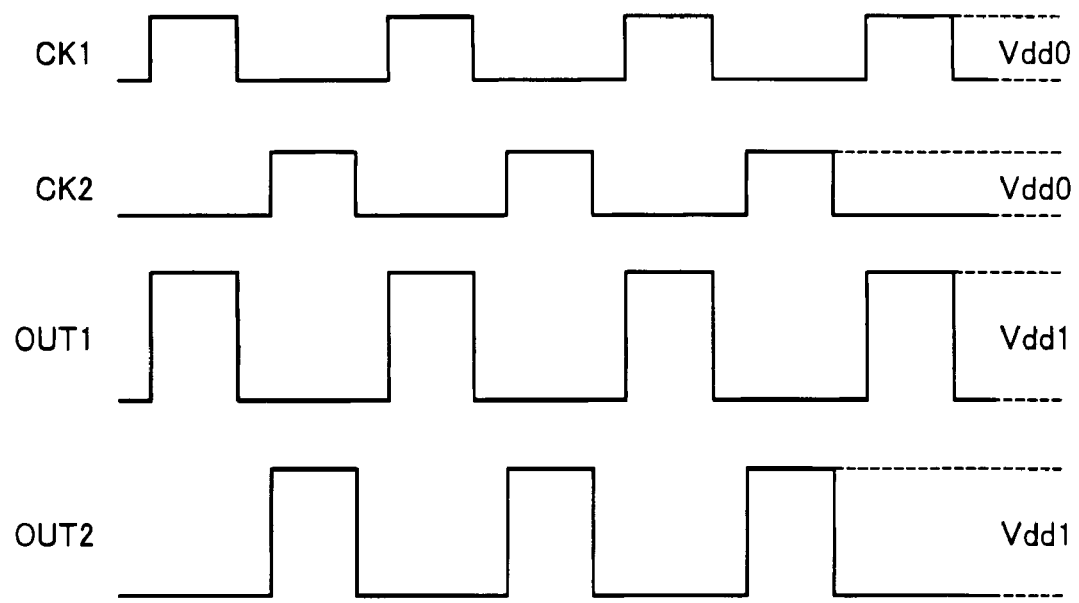
FIG. 22 is a timing chart showing clock signals supplied to the level shifter circuit of FIG. 21, and signals that are produced by level shifting of the clock signals.

As shown in FIG. 20, a horizontal period is time-sequentially divided into three parts, which are allocated to the input signals ASW1, ASW2, and ASW3, respectively. This enables the n switching signals SW1, SW2, and SW3 to open sequentially and supply n video signals to 3n source bus lines. By the input signals ASW1, ASW2, ASW3, the video signal lines are sequentially connected to the source bus lines. The video signals supplied to the video signal lines are also time-sequentially divided into three parts according to the active periods of the input signals ASW1, ASW2, ASW3, so as to supply required data to the corresponding source bus lines. That is, during one horizontal period, the video signal of one video signal line is supplied to three source bus lines.

Considering the case where the input signals SW1, SW2, SW3 are supplied to the SSD circuit from an external LSI of the image display panel, the amplitude of the input signals are smaller than the difference between high level and low level of the driving voltage inside the image display panel. In this case, it is required to level shift the input signals ASW1, ASW2, ASW3 to the high level and low level of the power voltage inside the image display panel.

Here, by suspending the operation of the level shifter circuit section using the level shifter circuit of the present invention during the time period in which the input signal does not require level shifting, the amount of steady current flow through the level shifter circuit section can be reduced and thereby the power consumed by the level shifter circuit can also be reduced. As a result, the power consumption of the image display device as a whole can be reduced by the amount of power reduced in the level shifter circuit.

Note that, even though the present embodiment described the case where a horizontal period is time-sequentially divided into three parts, it is also possible to divide a horizontal period into m parts, where m is an integer of not less than 2.

In order to achieve the foregoing object, the present invention provides a level shifter circuit that includes a level shifter for level shifting two kinds of clock signals which are out of phase with each other so as to have non-overlapping high level periods and/or non-overlapping low level periods, the level shifter being provided for each of the two kinds of clock signals and carrying out level shifting so that a high level of the clock signal is converted to either a high level or low level of a predetermined power voltage, and a low level of the clock signal is converted to the other level of the predetermined power voltage, the level shifter carrying out the level shifting using a predetermined voltage that is generated by flowing a predetermined constant current through a predetermined circuit of the level shifter during a non-active period of the corresponding clock signal, and the level shifter circuit further includes level shifting control means for suspending the level shifting during a specific time period of the non-active period, by preventing the constant current from flowing into the predetermined circuit.

According to this aspect of the invention, the level shifter carries out a normal level shifting operation during the active period of the clock signal and during the non-active period of the clock signal except for the specific time period.

The level shifting is carried out with respect to each of the two kinds of clock signals which are out of phase with each other so as to have non-overlapping high level periods and/or non-overlapping low level periods, so that a high level of the clock signal is converted to either a high level or low level of a predetermined power voltage, and a low level of the clock signal is converted to the other level of the predetermined power voltage.

During the non-active period other than the specific time period, the level shifter carries out the level shifting using a predetermined voltage that is generated by flowing a predetermined constant current in a predetermined circuit.

On the other hand, during the specific time period of the non-active period, the level shifting control means prevents the constant current from flowing into the predetermined circuit of the corresponding level shifter, so as to suspend the level shifting of the level shifter.

The non-active period does not require level shifting into a different level, and therefore by preventing the constant current from flowing into the predetermined circuit during the specific time period of the non-active period, the power dissipation, which would have been caused by the constant current, can be eliminated. As a result, the power consumption of the level shifter circuit can be reduced.

Further, in order to achieve the foregoing object, the level shifting control means of the level shifter circuit of the present invention in the specific period causes the level shifter to generate and output a non-active level that is different from a level of the clock signal resulting from the level shifting, using an alternative voltage that is generated by pull-up or pull-down to the power voltage, instead of using the predetermined voltage that is generated by flowing the constant current.

According to this aspect of the invention, the level shifting control means controls the level shifter so that the level shifter suspends the normal level shifting operation during the specific time period of the non-active period, while generating and outputting a non-active level that is different from a level of the clock signal resulting from level shifting.

The non-active level is generated using an alternative voltage that is generated by the pull up or pull down to the power voltage, instead of using a predetermined voltage that is generated by flowing the constant current in the predetermined circuit. This makes it possible to always obtain a voltage level for the non-active period during the specific time period of the non-active period, while reducing power consumption at the same time.

Further, in order to achieve the foregoing object, in the level shifter circuit of the present invention, the non-overlapping high level periods or the non-overlapping low level periods of the clock signals have a duty of less than (100×0.5) %.

According to this aspect of the invention, the high level periods or low level periods of the two kinds of clock signals never overlap. This enables any active period to be set, as required, to carry out level shifting.

Further, in order to achieve the foregoing object, in the level shifter circuit of the present invention, the predetermined circuit of the level shifter is at least one of a step-up section that raises the high level or low level of the clock signal to the high level of the power voltage that is higher than the high level of the clock signal, and a step-down section that lowers the other level of the clock signal to the low level of the power voltage that is lower than the low level of the clock signal, the step-up section and the step-down section each having a switching MOS transistor structure with a MOS transistor whose source receives the clock signal, and the step-up section and the step-down section each being of a current driving type by which the constant current is flown during the level shifting of the level shifter.

According to this aspect of the invention, the provision of at least one of the step-up section and step-down section allows for level shifting of the clock signal whose amplitude is smaller than the potential difference between the high level and low level of the power voltage, only in the active period of the clock signal, even when the threshold of the MOS transistor is greater than the amplitude of the clock signal and the characteristics of the MOS transistor are relatively poor.

Further, in order to achieve the foregoing object, in the level shifter circuit of the present invention, the predetermined circuit of the level shifter is at least one of a step-up section that raises the high level or low level of the clock signal to the high level of the power voltage that is higher than the high level of the clock signal, and a step-down section that lowers the other level of the clock signal to the low level of the power voltage that is lower than the low level of the clock signal, the step-up section and the step-down section each having a switching MOS transistor structure with a MOS transistor whose gate receives the clock signal, and the step-up section and the step-down section each being of a current driving type by which the constant current is flown during the level shifting of the level shifter.

According to this aspect of the invention, the provision of at least one of the step-up section and step-down section allows for level shifting of the clock signal whose amplitude is smaller than the potential difference between the high level and low level of the power voltage, only in the active period of the clock signal, even when the threshold of the MOS transistor is greater than the amplitude of the clock signal and the characteristics of the MOS transistor are relatively poor.

Further, since the input signal is supplied to the gate of the MOS transistor, there will be no unnecessary inflow or outflow of current at the input terminal of the input signal.

Further, in order to achieve the foregoing object, in the level shifter circuit of the present invention, the non-overlapping high level periods or the non-overlapping low level periods of the two kinds of clock signals are active periods of the clock signals, and the specific time period of one of the clock signals is the active period of the other clock signal.

According to this aspect of the invention, when the non-overlapping high level periods of the clock signals are the active period for example, the high level period of one of the clock signals corresponds to the specific time period in the non-active period of the other clock signal. Accordingly, only the level shifter that has received the clock signal of a high level carries out level shifting. That is, while the clock signal supplied to one of the level shifters is active, the level shifting of the level shifter that receives the other clock signal is suspended.

This enables the level shifting control means to use the signal which results from the level shifting of the clock signal of the active period, as a signal that suspends the level shifting of the other level shifter.

Further, in order to achieve the foregoing object, the present invention provides a level shifter circuit that includes a level shifter for level shifting N kinds of clock signals (N being an integer of not less than 2) which are out of phase with each other so as to have non-overlapping high level periods and/or non-overlapping low level periods, the level shifter being provided for each of the N kinds of clock signals and carrying out level shifting so that a high level of the clock signal is converted to either a high level or low level of a predetermined power voltage, and a low level of the clock signal is converted to the other level of the predetermined power voltage, the level shifter carrying out the level shifting using a predetermined voltage that is generated by flowing a predetermined constant current through a predetermined circuit of the level shifter during a non-active period of the corresponding clock signal, and the level shifter circuit further includes: active period detecting means for detecting an active period or a non-active period in the clock signal of the level shifter; and level shifting control means for suspending the level shifting during a specific time period of the non-active period as detected by the active period detecting means, by preventing the constant current from flowing into the predetermined circuit.

According to this aspect of the invention, the level shifter carries out a normal level shifting operation during the active period of the clock signal and during the non-active period of the clock signal except for the specific time period.

The level shifting is carried out with respect to each of the N kinds of clock signals which are out of phase with each other so as to have non-overlapping high level periods and/or non-overlapping low level periods, so that a high level of the clock signal is converted to either a high level or low level of a predetermined power voltage, and a low level of the clock signal is converted to the other level of the predetermined power voltage.

During the non-active period other than the specific time period, the level shifter carries out the level shifting using a predetermined voltage that is generated by flowing a predetermined constant current in a predetermined circuit.

The active period detecting means, detects an active period or anon-active period in the clock signal with respect to each level shifter, and the level shifting control means operates in the manner described below in the specific time period of the non-active period as detected by the active period detecting means.

During the specific time period of the non-active period, the level shifting control means prevents the predetermined constant current from flowing into the predetermined circuit of the level shifter, so as to suspend the level shifting of the level shifter.

The non-active period does not require level shifting into a different level, and therefore by preventing the constant current from flowing into the predetermined circuit during the specific time period of the non-active period, the power dissipation, which would have been caused by the constant current, can be eliminated. As a result, the power consumption of the level shifter circuit can be reduced.

Further, in order to achieve the foregoing object, in the level shifter circuit of the present invention, the level shifting control means in the specific period causes the level shifter to generate and output a non-active level that is different from a level of the clock signal resulting from the level shifting, using an alternative voltage that is generated by pull-up or pull-down to the power voltage, instead of using the predetermined voltage that is generated by flowing the constant current.

According to this aspect of the invention, the level shifting control means controls the level shifter so that the level shifter suspends the normal level shifting operation during the specific time period of the non-active period, while generating and outputting a non-active level that is different from a level of the clock signal resulting from level shifting. The non-active level is generated using an alternative voltage that is generated by the pull up or pull down to the power voltage, instead of using a predetermined voltage that is generated by flowing the constant current in the predetermined circuit. This makes it possible to always obtain a voltage level for the non-active period during the specific time period of the non-active period, while reducing power consumption at the same time.

Further, in order to achieve the foregoing object, in the level shifter circuit of the present invention, the non-overlapping high level periods or the non-overlapping low level periods of the clock signals have a duty of less than (100×1/N) %.

According to this aspect of the invention, the high level periods or low level periods of the N kinds of clock signals never overlap. This enables any active period to be set, as required, to carry out level shifting.

Further, in order to achieve the foregoing object, in the level shifter circuit of the present invention, the predetermined circuit of the level shifter is at least one of a step-up section that raises the high level or low level of the clock signal to the high level of the power voltage that is higher than the high level of the clock signal, and a step-down section that lowers the other level of the clock signal to the low level of the power voltage that is lower than the low level of the clock signal, the step-up section and the step-down section each having a switching MOS transistor structure with a MOS transistor whose source receives the clock signal, and the step-up section and the step-down section each being of a current driving type by which the constant current is flown during the level shifting of the level shifter.

According to this aspect of the invention, the provision of at least one of the step-up section and step-down section allows for level shifting of the clock signal whose amplitude is smaller than the potential difference between the high level and low level of the power voltage, only in the active period of the clock signal, even when the threshold of the MOS transistor is greater than the amplitude of the clock signal and the characteristics of the MOS transistor are relatively poor.

Further, in order to achieve the foregoing object, in the level shifter circuit of the present invention, the predetermined circuit of the level shifter is at least one of a step-up section that raises the high level or low level of the clock signal to the high level of the power voltage that is higher than the high level of the clock signal, and a step-down section that lowers the other level of the clock signal to the low level of the power voltage that is lower than the low level of the clock signal, the step-up section and the step-down section each having a switching MOS transistor structure with a MOS transistor whose gate receives the clock signal, and the step-up section and the step-down section each being of a current driving type by which the constant current is flown during the level shifting of the level shifter.

According to this aspect of the invention, the provision of at least one of the step-up section and step-down section allows for level shifting of the clock signal whose amplitude is smaller than the potential difference between the high level and low level of the power voltage, only in the active period of the clock signal, even when the threshold of the MOS transistor is greater than the amplitude of the clock signal and the characteristics of the MOS transistor are relatively poor.

Further, since the input signal is supplied to the gate of the MOS transistor, there will be no unnecessary inflow or outflow of current at the input terminal of the input signal.

Further, in order to achieve the foregoing object, in the level shifter circuit of the present invention, the non-overlapping high level periods or the non-overlapping low level periods of the N kinds of clock signals are active periods of the clock signals, and the specific time period of one of the clock signals is the active period of all the other clock signals.

According to this aspect of the invention, when the non-overlapping high level periods of the clock signals are the active period for example, the high level period of one of the clock signals corresponds to the specific time period in the non-active period of the other clock signal. Accordingly, only the level shifter that has received the clock signal of a high level carries out level shifting. That is, while the clock signal supplied to one of the level shifters is active, the level shifting of the level shifter that receives the other clock signal is suspended.

This enables the level shifting control means to use the signal which results from the level shifting of the clock signal of the active period as detected by the active period detecting means, as a signal that suspends the level shifting of the other level shifter.

Further, in order to achieve the foregoing object, in the level shifter circuit of the present invention, the active period of the clock signal is the high level period.

According to this aspect of the invention, among the level shifters that receive the N kinds of clock signals of non-overlapping high level periods (active periods), only the level shifter that has received the clock signal of a high level carries out the level shifting to the power voltage, while the level shifting control means suspends level shifting of the other level shifters.

The active period detecting means detects an active period in the clock signal supplied to the level shifter, and the level shifting control means uses the result of level shifting of the clock signal to the high level of the power voltage as a signal for suspending the level shifting of the other level shifters.

Further, in order to achieve the foregoing object, in the level shifter circuit of the present invention, the active period of the clock signal is the low level period.

According to this aspect of the invention, among the level shifters that receive the N kinds of clock signals of non-overlapping low level periods (active periods), only the level shifter that has received the clock signal of a low level carries out the level shifting to the power voltage, while the level shifting control means suspends level shifting of the other level shifters.

The active period detecting means detects an active period in the clock signal supplied to the level shifter, and the level shifting control means uses the result of level shifting of the clock signal to the low level of the power voltage as a signal for suspending the level shifting of the other level shifters.

Further, in order to achieve the foregoing object, in the level shifter circuit of the present invention, the level shifter includes an offsetter section which generates and outputs a common offset voltage for level shifting, and a level shift section which receives the common offset voltage so as to carry out level shifting, and the predetermined circuit is included in the level shift section, and the level shift section at least partially carries out level shifting in response to input of the common offset voltage, and the level shifting control means prevents the common offset voltage from being supplied to the predetermined circuit during the specific time period, so as to prevent the constant current from flowing into the predetermined circuit and thereby suspend the level shifting.

According to this aspect of the invention, the level shifter includes the offsetter section and the level shift section, and the level shift section includes the predetermined circuit. In response to the input of the offset voltage that is generated by the offsetter section, the level shift section at least partially carries out the level shifting.

The level shifting control means prevents the offset voltage from being supplied to the predetermined circuit during the specific time period of the non-active period, so as to prevent the constant current from flowing into the predetermined circuit and thereby suspend the level shifting of the level shift section. The offsetter section which generates and outputs the offset voltage irrespective of whether the clock signal is in a specific time period or not is commonly provided for all the level shifters. This simplifies the circuit structure and reduces power consumption.

The level shifter circuit of the present invention may be adapted so that the level shifting control means of one level shifter finds the specific time period based on an output supplied from the other level shifter. According to this aspect of the invention, the level shifting control means finds the specific time period based on the output of the other level shifter. This ensures that the specific time period is found without fail.

Further, in order to achieve the foregoing object, the present invention provides a display device that includes: a plurality of pixels; a plurality of data signal lines; a plurality of scanning signal lines; a scanning signal line driver which supplies a scanning signal to the scanning signal lines in synchronism with a first clock signal of a predetermined period; and a data signal line driver which receives a video signal, indicative of a display state of the pixels, that is supplied in synchronism with a second clock signal of a predetermined period, and extracts therefrom a data signal for a pixel of a scanning signal line that has been supplied with the scanning signal, so as to output the data signal to the data signal lines, and the display device further includes any one of the foregoing level shifter circuits, at least one of the first clock signal and the second clock signal being N kinds of clock signals (N being an integer of not less than 2) which are out of phase with each other so as to have non-overlapping high level periods and/or non-overlapping low level periods.

According to this aspect of the invention, in the display device in which clock signals having non-overlapping high level periods and/or non-overlapping low level periods are supplied to at least one of the scanning signal line driver and the data signal line driver after the clock signals are level shifted to the driving voltage of these drivers, the power consumption of the display device as a whole can be reduced by the amount of power dissipation eliminated in the level shifter circuit.

In order to achieve the foregoing object, in the display device of the present invention, at least one of the scanning signal line driver and the data signal line driver, which receive the N kinds of clock signals that are produced by level shifting in the level shifter circuit, are formed on a substrate on which the level shifter circuit and the pixels are formed.

According to this aspect of the invention, the scanning signal line driver and/or the data signal line driver, which receive the N kinds of clock signals that are level shifted by the level shifter circuit, can be formed with the level shifter circuit on the same substrate as the pixels, thereby enabling the wiring for the clock signals to be formed on the same substrate.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:
1. A level shifter circuit, comprising:
a level shifter for level shifting two kinds of clock signals which are out of phase with each other so as to have non-overlapping high level periods and/or non-overlapping low level periods, said level shifter being provided for each of the two kinds of clock signals and carrying out level shifting so that a high level of the clock signal is converted to either a high level or low level of a predetermined power voltage, and a low level of the clock signal is converted to the other level of the predetermined power voltage,
said level shifter carrying out the level shifting using a predetermined voltage that is generated by flowing a predetermined constant current through a predetermined circuit of the level shifter during a non-active period of the corresponding clock signal; and
level shifting control circuitry for suspending the level shifting during a specific time period of the non-active period, by preventing the constant current from flowing into the predetermined circuit,
wherein the level shifting control circuitry uses an output voltage which results from level shifting in an active period of the other clock signal different from the corresponding clock signal so as to prevent the constant current from flowing into the predetermined circuit, and wherein the specific time period of the non-active period corresponds to the active period of the other clock signal.

2. The level shifter circuit as set forth in claim 1, wherein the level shifting control circuitry in the specific period causes the level shifter to generate and output a non-active level that is different from a level of the clock signal resulting from the level shifting, using an alternative voltage that is generated by pull-up or pull-down to the power voltage, instead of using the predetermined voltage that is generated by flowing the constant current.

3. The level shifter circuit as set forth in claim 1, wherein the non-overlapping high level periods or the non-overlapping low level periods of the clock signals have a duty of less than (100×0.5) %.

4. The level shifter circuit as set forth in claim 1, wherein the predetermined circuit of the level shifter is at least one of a step-up section that raises the high level or low level of the clock signal to the high level of the power voltage that is higher than the high level of the clock signal, and a step-down section that lowers the other level of the clock signal to the low level of the power voltage that is lower than the low level of the clock signal,
the step-up section and the step-down section each includes a switching MOS transistor structure comprising a MOS transistor whose source receives the clock signal, and the step-up section and the step-down section each being of a current driving type by which the constant current flows during the level shifting of the level shifter.

5. The level shifter circuit as set forth in claim 1, wherein the predetermined circuit of the level shifter is at least one of a step-up section that raises the high level or low level of the clock signal to the high level of the power voltage that is higher than the high level of the clock signal, and a step-down section that lowers the other level of the clock signal to the low level of the power voltage that is lower than the low level of the clock signal,
the step-up section and the step-down section each includes a switching MOS transistor structure comprising a MOS transistor whose gate receives the clock signal, and the step-up section and the step-down section each being of a current driving type by which the constant current flows during the level shifting of the level shifter.

6. The level shifter circuit as set forth in claim 1, wherein:
the level shifter includes an offsetter section which generates and outputs a common offset voltage for level shifting, and a level shift section which receives the common offset voltage so as to carry out level shifting, and
the predetermined circuit is included in the level shift section, and the level shift section at least partially carries out level shifting in response to input of the common offset voltage, and
the level shifting control circuitry prevents the common offset voltage from being supplied to the predetermined circuit during the specific time period, so as to prevent the constant current from flowing into the predetermined circuit and thereby suspend the level shifting.

7. The level shifter circuit as set forth in claim 1, wherein the output voltage used by the level shifting control circuitry is supplied from another level shifter.

8. A level shifter circuit, comprising:
a level shifter for level shifting N kinds of clock signals (N being an integer of not less than 2) which are out of phase with each other so as to have non-overlapping high level periods and/or non-overlapping low level periods, said level shifter being provided for each of the N kinds of clock signals and carrying out level shifting so that a high level of the clock signal is converted to either a high level or low level of a predetermined power voltage, and a low level of the clock signal is converted to the other level of the predetermined power voltage,
said level shifter carrying out the level shifting using a predetermined voltage that is generated by flowing a predetermined constant current through a predetermined circuit of the level shifter during a non-active period of the corresponding clock signal;
active period detecting circuitry for detecting an active period or a non-active period in the clock signal of the level shifter; and
level shifting control circuitry for suspending the level shifting during a specific time period of the non-active period as detected by the active period detecting circuitry, by preventing the constant current from flowing into the predetermined circuit,
wherein the level shifting control circuitry uses an output voltage which results from level shifting in an active period of another clock signal different from the corresponding clock signal so as to prevent the constant current from flowing into the predetermined circuit, and
wherein the specific time period of the non-active period corresponds to the active period of the other clock signal.

9. The level shifter circuit as set forth in claim 8, wherein the level shifting control circuitry in the specific period causes the level shifter to generate and output a non-active level that is different from a level of the clock signal resulting from the level shifting, using an alternative voltage that is generated by pull-up or pull-down to the power voltage, instead of using the predetermined voltage that is generated by flowing the constant current.

10. The level shifter circuit as set forth in claim 8, wherein the non-overlapping high level periods or the non-overlapping low level periods of the clock signals have a duty of less than (100×1/N) %.

11. The level shifter circuit as set forth in claim 8, wherein the predetermined circuit of the level shifter is at least one of a step-up section that raises the high level or low level of the clock signal to the high level of the power voltage that is higher than the high level of the clock signal, and a step-down section that lowers the other level of the clock signal to the low level of the power voltage that is lower than the low level of the clock signal,
the step-up section and the step-down section each including a switching MOS transistor structure comprising a MOS transistor whose source receives the clock signal, and the step-up section and the step-down section each being of a current driving type by which the constant current flows during the level shifting of the level shifter.

12. The level shifter circuit as set forth in claim 8, wherein the predetermined circuit of the level shifter is at least one of a step-up section that raises the high level or low level of the clock signal to the high level of the power voltage that is higher than the high level of the clock signal, and a step-down section that lowers the other level of the clock signal to the low level of the power voltage that is lower than the low level of the clock signal,
the step-up section and the step-down section each including a switching MOS transistor structure comprising a MOS transistor whose gate receives the clock signal, and the step-up section and the step-down section each being of a current driving type by which the constant current flows during the level shifting of the level shifter.

13. The level shifter circuit as set forth in claim 8, wherein the active period of the clock signal is the high level period.

14. The level shifter circuit as set forth in claim 8, wherein the active period of the clock signal is the low level period.

15. The level shifter circuit as set forth in claim 8, wherein:
the level shifter includes an offsetter section which generates and outputs a common offset voltage for level shifting, and a level shift section which receives the common offset voltage so as to carry out level shifting, and
the predetermined circuit is included in the level shift section, and the level shift section at least partially carries out level shifting in response to input of the common offset voltage, and
the level shifting control circuitry prevents the common offset voltage from being supplied to the predetermined circuit during the specific time period, so as to prevent the constant current from flowing into the predetermined circuit and thereby suspend the level shifting.

16. The level shifter circuit as set forth in claim 8, wherein the output voltage used by the level shifting control circuitry is supplied from another level shifter.

17. A display device comprising:
a plurality of pixels;
a plurality of data signal lines;
a plurality of scanning signal lines;
a scanning signal line driver which supplies a scanning signal to the scanning signal lines in synchronism with scanning operation clock signals of a predetermined period;
a data signal line driver which receives a video signal, indicative of a display state of the pixels, that is supplied in synchronism with data operation clock signals of a predetermined period, and extracts therefrom a data signal for a pixel of a scanning signal line that has been supplied with the scanning signal, so as to output the data signal to the data signal lines; and
a level shifter circuit, at least one of the scanning operation clock signals and the data operation clock signals including two kinds of clock signals which are out of phase with each other so as to have non-overlapping high level periods and/or non-overlapping low level periods,
said level shifter circuit including a level shifter which is provided for each of the two kinds of clock signals and carries out level shifting so that a high level of the clock signal is converted to either a high level or low level of a predetermined power voltage, and a low level of the clock signal is converted to the other level of the predetermined power voltage,
the level shifter carrying out the level shifting using a predetermined voltage that is generated by flowing a predetermined constant current through a predetermined circuit of the level shifter during a non-active period of the corresponding clock signal, and
said level shifter circuit further including level shifting control circuitry for suspending the level shifting during a specific time period of the non-active period, by preventing the constant current from flowing into the predetermined circuit,
wherein the level shifting control circuitry uses an output voltage which results from level shifting in an active period of the other clock signal different from the corresponding clock signal so as to prevent the constant current from flowing into the predetermined circuit and
wherein the specific time period of the non-active period corresponds to the active period of the other clock signal.

18. The display device as set forth in claim 17, wherein at least one of the scanning signal line driver and the data signal line driver, which receive the two kinds of clock signals that are produced by level shifting in the level shifter circuit, are formed on a substrate on which the level shifter circuit and the pixels are formed.

19. A display device comprising:
a plurality of pixels;
a plurality of data signal lines;
a plurality of scanning signal lines;
a scanning signal line driver which supplies a scanning signal to the scanning signal lines in synchronism with scanning operation clock signals of a predetermined period;
a data signal line driver which receives a video signal, indicative of a display state of the pixels, that is supplied in synchronism with data operation clock signals of a predetermined period, and extracts therefrom a data signal for a pixel of a scanning signal line that has been supplied with the scanning signal, so as to output the data signal to the data signal lines; and
a level shifter circuit,
at least one of the scanning operation clock signals and the data operation clock signals including N kinds of clock signals (N being an integer of not less than 2) which are out of phase with each other so as to have non-overlapping high level periods and/or non-overlapping low level periods,
said level shifter circuit including a level shifter which is provided for each of the N kinds of clock signals and carries out level shifting so that a high level of the clock signal is converted to either a high level or low level of a predetermined power voltage, and a low level of the clock signal is converted to the other level of the predetermined power voltage,
the level shifter carrying out the level shifting using a predetermined voltage that is generated by flowing a predetermined constant current through a predetermined circuit of the level shifter during a non-active period of the corresponding clock signal, and
said level shifter circuit further including:
active period detecting circuitry for detecting an active period or a non-active period in the clock signal of the level shifter; and
level shifting control circuitry for suspending the level shifting during a specific time period of the non-active period as detected by the active period detecting circuitry, by preventing the constant current from flowing into the predetermined circuit,
wherein the level shifting control circuitry uses an output voltage which results from level shifting in an active period of another clock signal different from the corresponding clock signal so as to prevent the constant current from flowing into the predetermined circuit
wherein the specific time period of the non-active period corresponds to the active period of the other clock signal.

20. The display device as set forth in claim 19, wherein at least one of the scanning signal line driver and the data signal line driver, which receive the N kinds of clock signals that are produced by level shifting in the level shifter circuit, are formed on a substrate on which the level shifter circuit and the pixels are formed.

21. A level shifter circuit for level shifting first and second clock signals which are out of phase with each other so as to have non-overlapping high level periods and/or non-overlapping low level periods, the level shifter circuit carrying out level shifting so that a high level of the clock signal is converted to either a high level or low level of a specified power voltage, and a low level of the clock signal is converted to the other level of the specified power voltage,
the level shifter circuit comprising:
a first level shifter for performing the level shifting for the first clock signal;

a second level shifter for performing the level shifting for the second clock signal;

the first level shifter carrying out the level shifting using a voltage that is generated by flowing a constant current through a circuit of the first level shifter during a non-active period of the first clock signal;

the second level shifter carrying out the level shifting using a voltage that is generated by flowing a constant current through a circuit of the first level shifter during a non-active period of the second clock signal;

first level shifting control circuitry which uses an output voltage resulting from level shifting by the second level shifter in an active period of the second clock signal to cause the first level shifter to suspend the level shifting during a specific time period of the non-active period of the first clock signal, by preventing the constant current from flowing into the circuit of the first level shifter; and second level shifting control circuitry which uses an output voltage resulting from level shifting by the first level shifter in an active period of the first clock signal to cause the second level shifter to suspend the level shifting during the non-active period of the second clock signal, by preventing the constant current from flowing into the circuit of the second level shifter, wherein the specific time period of the non-active period corresponds to the active period of the other clock signal.

22. A level shifter circuit for level shifting N kinds of clock signals (N being an integer of not less than 2) which are out of phase with each other so as to have non-overlapping high level periods and/or non-overlapping low level periods, said level shifter circuit carrying out level shifting so that a high level of the clock signal is converted to either a high level or low level of a specified power voltage, and a low level of the clock signal is converted to the other level of the specified power voltage, the level shifter circuit comprising:

respective level shifters for performing the level shifting for a corresponding one of the clock signals, each level shifter carrying out the level shifting using a voltage that is generated by flowing a constant current through a circuit thereof during a non-active period of a corresponding clock signal; and level shifting control circuitry for causing the respective level shifters to suspend the level shifting during a specific time period of the non-active period of the corresponding clock signal, by preventing the constant current from flowing into the circuit of the respective level shifter, wherein the level shifting control circuitry uses an output voltage which results from level shifting by the first level shifter in an active period of the corresponding clock signal of the first level shifter, which is different than the corresponding clock signal of the second level shifter, to prevent the constant current from flowing into the circuit of second level shifter, wherein the specific time period of the non-active period corresponds to the active period of the other clock signal.

23. A display device comprising:
a plurality of pixels;
a plurality of data signal lines;
a plurality of scanning signal lines;
a scanning signal line driver which supplies a scanning signal to the scanning signal lines in synchronism with scanning operation clock signals;
a data signal line driver which receives a video signal, indicative of a display state of the pixels, that is supplied in synchronism with data operation clock signals, and extracts therefrom a data signal for a pixel of a scanning signal line that has been supplied with the scanning signal, so as to output the data signal to the data signal lines, wherein at least one of the scanning operation clock signals and the data operation clock signals includes first and second clock signals which are out of phase with each other so as to have non-overlapping high level periods and/or non-overlapping low level periods; and a level shifter circuit, the level shifter circuit carrying out level shifting so that a high level clock signal is converted to either a high level or low level of a specified power voltage, and a low level clock signal is converted to the other level of the specified power voltage, the level shifter circuit comprising:

a first level shifter for performing the level shifting for the first clock signal;

a second level shifter for performing the level shifting for the second clock signal;

the first level shifter carrying out the level shifting using a voltage that is generated by flowing a constant current through a circuit of the first level shifter during a non-active period of the first clock signal;

the second level shifter carrying out the level shifting using a voltage that is generated by flowing a constant current through a circuit of the first level shifter during a non-active period of the second clock signal;

first level shifting control circuitry which uses an output voltage resulting from level shifting by the second level shifter in an active period of the second clock signal to cause the first level shifter to suspend the level shifting during a specific time period of the non-active period of the first clock signal, by preventing the constant current from flowing into the circuit of the first level shifter; and second level shifting control circuitry which uses an output voltage resulting from level shifting by the first level shifter in an active period of the first clock signal to cause the second level shifter to suspend the level shifting during the non-active period of the second clock signal, by preventing the constant current from flowing into the circuit of the second level shifter, wherein the specific time period of the non-active period corresponds to the active period of the other clock signal.

24. A display device comprising:
a plurality of pixels;
a plurality of data signal lines;
a plurality of scanning signal lines;
a scanning signal line driver which supplies a scanning signal to the scanning signal lines in synchronism with scanning operation clock signals;
a data signal line driver which receives a video signal, indicative of a display state of the pixels, that is supplied in synchronism with data operation clock signals, and extracts therefrom a data signal for a pixel of a scanning signal line that has been supplied with the scanning signal, so as to output the data signal to the data signal lines, wherein at least one of the scanning operation clock signals and the data operation clock signals includes N kinds of clock signals (N being an integer of not less than 2) which are out of phase with each other so as to have non-overlapping high level periods and/or non-overlapping low level periods; and a level shifter circuit comprising:
respective level shifters for performing the level shifting for a corresponding one of the N kinds of clock signals, each level shifter carrying out the level shifting using a voltage that is generated by flowing a constant current through a circuit thereof during a non-active period of the corresponding clock signal;

level shifting control circuitry for causing the respective level shifters to suspend the level shifting during a specific time period of the non-active period of the corresponding clock signal, by preventing the constant current from flowing into the circuit of the respective level shifter, wherein the level shifting control circuitry uses an output voltage which results from level shifting by the first level shifter in an active period of the corresponding clock signal of the first level shifter, which is different than the corresponding clock signal of the second level shifter, to prevent the constant current from flowing into the circuit of second level shifter, wherein the specific time period of the non-active period corresponds to the active period of the other clock signal.

25. A level shifter circuit, comprising:

a level shifter for level shifting N kinds of clock signals (N being an integer of not less than 2) which are out of phase with each other so as to have non-overlapping high level periods and/or non-overlapping low level periods, the level shifter being provided for each of the N kinds of clock signals and carrying out level shifting so that a high level of the clock signal is converted to either a high level or low level of a predetermined power voltage, and a low level of the clock signal is converted to the other level of the predetermined power voltage, the level shifter carrying out the level shifting using a predetermined voltage that is generated by flowing a predetermined constant current through a predetermined circuit of the level shifter during a non-active period of the corresponding clock signal;

active period detecting circuitry for detecting an active period or a non-active period in the clock signal of the level shifter; and level shifting control circuitry for suspending the level shifting during a specific time period of the non-active period as detected by the active period detecting circuitry, by preventing the constant current from flowing into the predetermined circuit, wherein the level shifting control circuitry uses an output voltage which results from level shifting in an active period of another clock signal different from the corresponding clock signal so as to prevent the constant current from flowing into the predetermined circuit, wherein the specific time period of the non-active period corresponds to the active period of the other clock signal.

26. A display device comprising:
a plurality of pixels;
a plurality of data signal lines;
a plurality of scanning signal lines;
a scanning signal line driver which supplies a scanning signal to the scanning signal lines in synchronism with scanning operation clock signals of a predetermined period;
a data signal line driver which receives a video signal, indicative of a display state of the pixels, that is supplied in synchronism with data operation clock signals of a predetermined period, and extracts therefrom a data signal for a pixel of a scanning signal line that has been supplied with the scanning signal, so as to output the data signal to the data signal lines; and
a level shifter circuit,
at least one of the scanning operation clock signals and the data operation clock signals including N kinds of clock signals (N being an integer of not less than 2) which are out of phase with each other so as to have non-overlapping high level periods and/or non-overlapping low level periods,
the level shifter circuit including a level shifter which is provided for each of the N kinds of clock signals and carries out level shifting so that a high level of the clock signal is converted to either a high level or low level of a predetermined power voltage, and a low level of the clock signal is converted to the other level of the predetermined power voltage,
the level shifter carrying out the level shifting using a predetermined voltage that is generated by flowing a predetermined constant current through a predetermined circuit of the level shifter during a non-active period of the corresponding clock signal,
the level shifter circuit further including:
active period detecting circuitry for detecting an active period or a non-active period in the clock signal of the level shifter; and
level shifting control circuitry for suspending the level shifting during a specific time period of the non-active period as detected by the active period detecting circuitry, by preventing the constant current from flowing into the predetermined circuit,
wherein the level shifting control circuitry uses an output voltage which results from level shifting in an active period of another clock signal different from the corresponding clock signal so as to prevent the constant current from flowing into the predetermined circuit,
wherein the specific time period of the non-active period corresponds to the active period of the other clock signal.

* * * * *